United States Patent
Yu et al.

(10) Patent No.: US 9,620,488 B2
(45) Date of Patent: Apr. 11, 2017

(54) THREE-DIMENSIONAL INTEGRATED CIRCUIT STRUCTURE AND BONDED STRUCTURE

(71) Applicant: Taiwan Semiconductor Manufacturing Co., Ltd., Hsin-Chu (TW)

(72) Inventors: Chen-Hua Yu, Hsinchu (TW); Sung-Feng Yeh, Taipei (TW); Ming-Fa Chen, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/830,732

(22) Filed: Aug. 19, 2015

(65) Prior Publication Data

US 2017/0053902 A1 Feb. 23, 2017

(51) Int. Cl.
*H01L 21/02* (2006.01)
*H01L 25/10* (2006.01)
*H01L 23/522* (2006.01)
*H01L 23/528* (2006.01)

(52) U.S. Cl.
CPC .......... *H01L 25/105* (2013.01); *H01L 23/528* (2013.01); *H01L 23/5226* (2013.01); *H01L 2225/1047* (2013.01)

(58) Field of Classification Search
CPC . H01L 21/768; H01L 21/76898; H01L 23/48; H01L 23/481; H01L 23/498; H01L 23/522; H01L 23/532

USPC .......................................................... 257/774
See application file for complete search history.

(56) References Cited

U.S. PATENT DOCUMENTS

| | | | |
|---|---|---|---|
| 2010/0096760 A1* | 4/2010 | Yu | H01L 24/05 257/774 |
| 2012/0056330 A1* | 3/2012 | Lee | H01L 21/76898 257/774 |
| 2012/0133048 A1* | 5/2012 | Lee | H01L 21/76898 257/774 |

(Continued)

FOREIGN PATENT DOCUMENTS

| | | |
|---|---|---|
| EP | 0055795 | 7/1982 |
| JP | 2011258687 | 12/2011 |

(Continued)

OTHER PUBLICATIONS

"Office Action of German Counterpart Application", issued on Apr. 22, 2016, p. 1-p. 6.

(Continued)

*Primary Examiner* — Michael Lebentritt
(74) *Attorney, Agent, or Firm* — Jianq Chyun IP Office

(57) ABSTRACT

Three-dimensional integrated circuit (3DIC) structures are disclosed. A 3DIC structure includes a first chip, a second chip and at least one through substrate via (TSV). The first chip is electrically connected to the second chip with a first bonding pad of the first chip and a second bonding pad of the second chip. The TSV extends from a first backside of the first chip to a metallization element of the first chip. At least one conductive via is electrically connected between the TSV and the first bonding pad, and at least one elongated slot or closed space is within the at least one conductive via.

20 Claims, 20 Drawing Sheets

(56) References Cited

U.S. PATENT DOCUMENTS

| | | | |
|---|---|---|---|
| 2012/0142185 A1* | 6/2012 | Park | H01L 21/76898 438/667 |
| 2013/0119543 A1* | 5/2013 | Yu | H01L 21/76898 257/741 |
| 2013/0264676 A1* | 10/2013 | Yang | H01L 23/5226 257/508 |
| 2013/0270712 A1* | 10/2013 | Chen | H01L 21/76898 257/774 |
| 2013/0277735 A1 | 10/2013 | Kinzer et al. | |
| 2013/0328186 A1* | 12/2013 | Uzoh | H01L 21/76898 257/737 |
| 2014/0061940 A1 | 3/2014 | Kitao et al. | |
| 2014/0124951 A1* | 5/2014 | Lee | H01L 23/585 257/774 |
| 2014/0217603 A1* | 8/2014 | Moon | H01L 23/49827 257/774 |
| 2015/0137388 A1* | 5/2015 | Kim | H01L 23/481 257/774 |
| 2015/0187733 A1 | 7/2015 | Batra et al. | |
| 2016/0086874 A1* | 3/2016 | Choi | H01L 23/481 257/751 |
| 2016/0099201 A1* | 4/2016 | Choi | H01L 23/481 257/621 |

FOREIGN PATENT DOCUMENTS

| | | |
|---|---|---|
| JP | 2013201353 | 10/2013 |
| TW | 201409644 | 3/2014 |

OTHER PUBLICATIONS

"Office Action of Taiwan Counterpart Application", issued on Dec. 30, 2016, p1-p4, in which the listed references were cited.

* cited by examiner

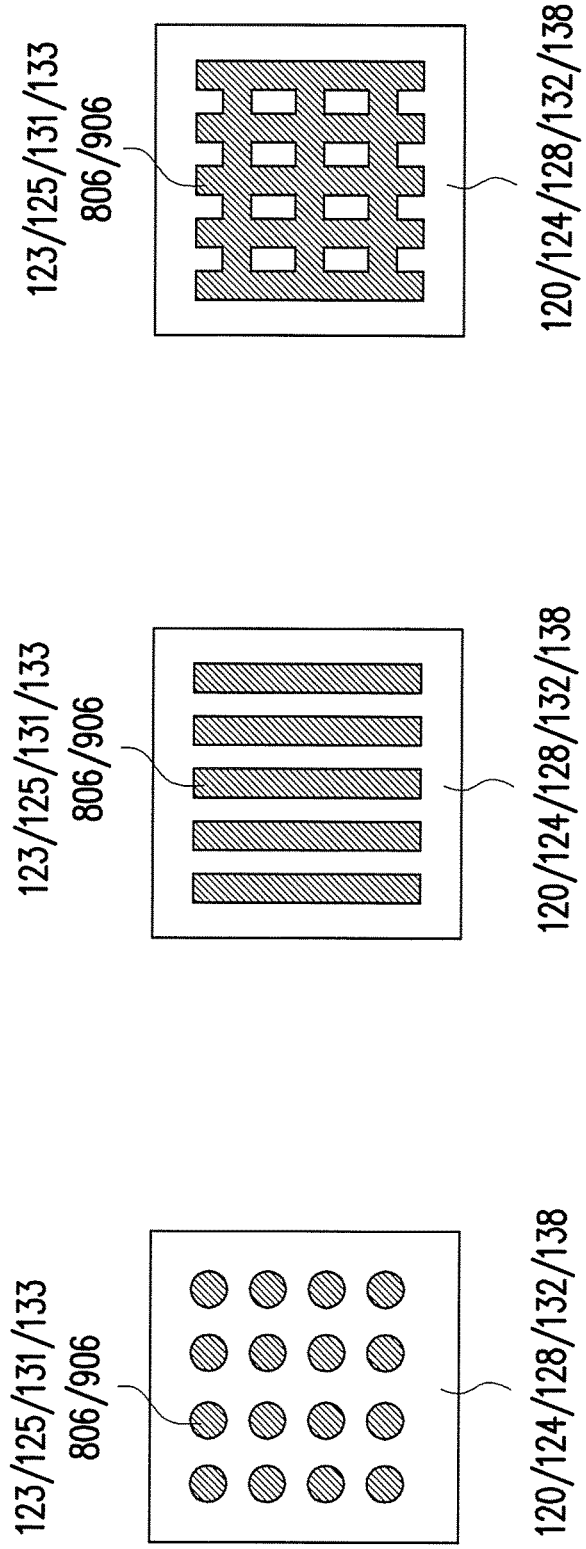

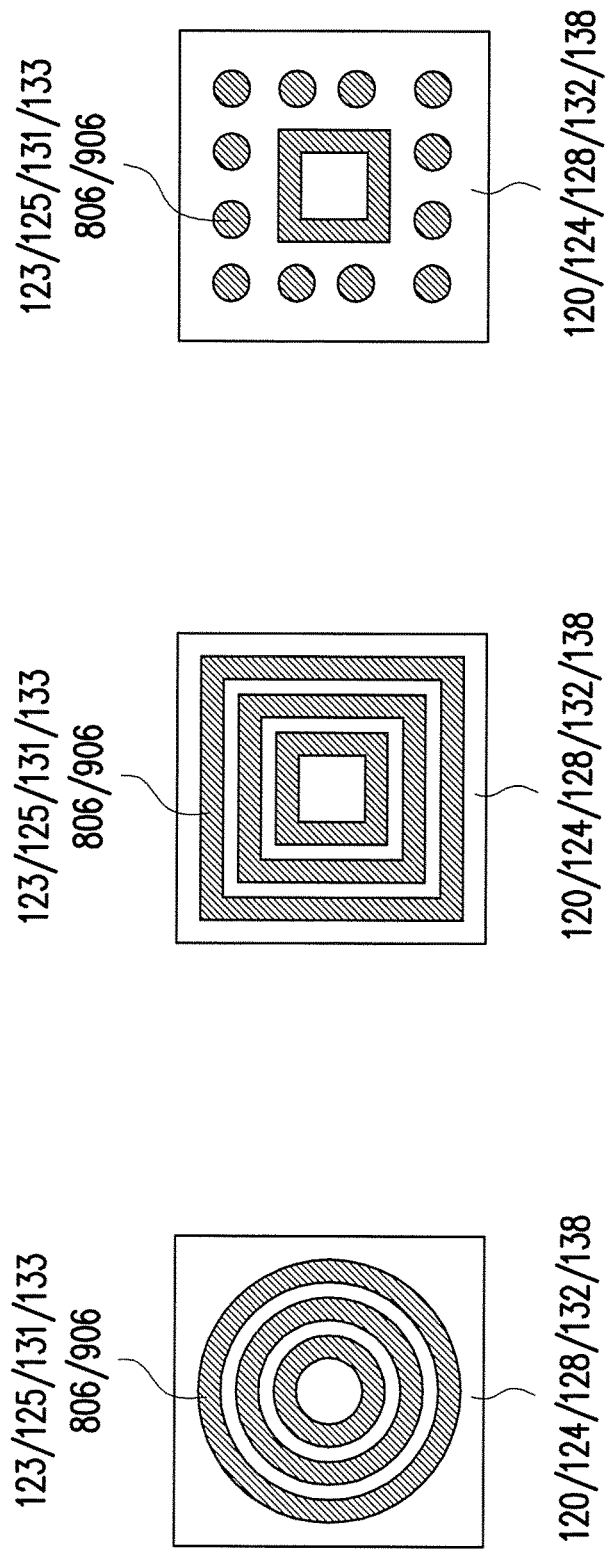

THREE-DIMENSIONAL INTEGRATED CIRCUIT STRUCTURE AND BONDED STRUCTURE

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), and package on package (PoP) devices. Some 3DICs are prepared by placing chips over chips on a semiconductor wafer level. The 3DICs provide improved integration density and other advantages, such as faster speeds and higher bandwidth, because of the decreased length of interconnects between the stacked chips. However, there are many challenges related to 3DICs.

BRIEF DESCRIPTION OF THE DRAWINGS

FIG. 5 to FIG. 10 are local top views of conductive vias and the adjacent conductive layers of a 3DIC structure in accordance with some embodiments.

DETAILED DESCRIPTION

Figure 1A:
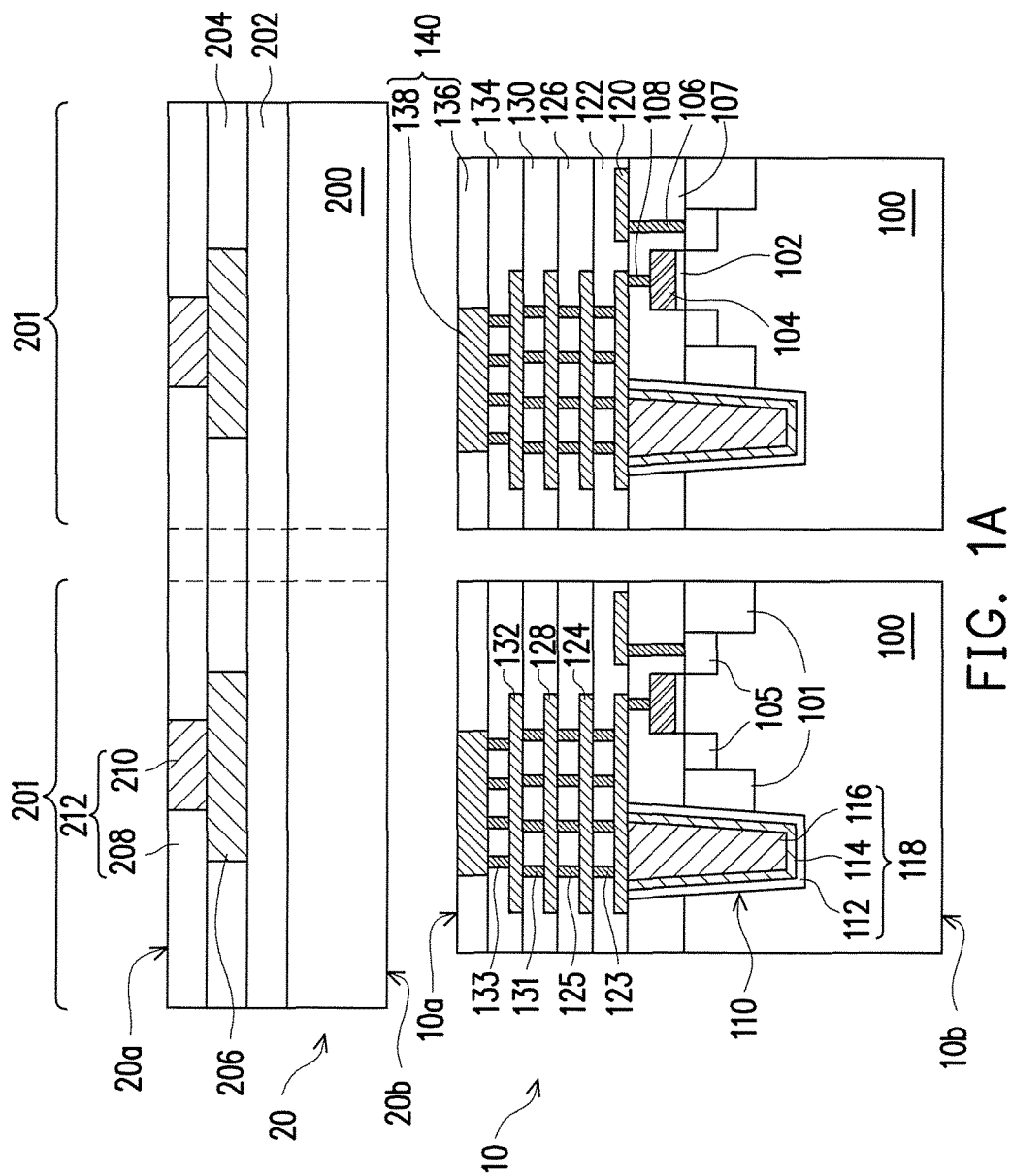
FIG. 1A to FIG. 1F are cross-sectional views of a method of forming a 3DIC structure in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of reference numerals is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1F are cross-sectional views of a method of forming a 3DIC structure in accordance with some embodiments.

Referring to FIG. 1A, a plurality of first chips 10 is provided. In some embodiments, each first chip 10 includes isolation structures 101 defining at least one active area, a gate dielectric layer 102, a gate 104 over a first substrate 100 in the active area, source/drain regions 105 in the first substrate 100 beside the gate 104, and a dielectric layer 107 overlying the gate 104. In some embodiments, the first substrate 100 includes an elementary semiconductor such as silicon or germanium and/or a compound semiconductor such as silicon germanium, silicon carbide, gallium arsenic, indium arsenide, gallium nitride or indium phosphide. In some embodiments, the first substrate 100 is a semiconductor-on-insulator (SOI) substrate. In various embodiments, the first substrate 100 may take the form of a planar substrate, a substrate with multiple fins, nanowires, or other forms known to people having ordinary skill in the art. The isolation structures 101 are shallow trench isolation (STI) structures. The gate dielectric layer 102 is made of silicon oxide, a high dielectric constant (high-k) material or a combination thereof. In some embodiments, the high-k material has a dielectric constant of greater than about 4 or even greater than about 10. In some embodiments, the high-k material includes metal oxide, such as titanium oxide ($TiO_2$), zirconium oxide ($ZrO_2$), hafnium oxide ($HfO_2$), tantalum oxide ($Ta_2O_5$), and barium and strontium titanium oxide (($Ba,Sr)TiO_3$) or a combination thereof. In some embodiments, the gate 104 is a metal gate including metal, metal alloy, metal silicide or a combination thereof. In alternative embodiments, the gate 104 is a polysilicon gate. The source/drain regions 105 include epitaxial layers (e.g., SiGe or SiC) and/or doped regions therein.

In some embodiments, at least one plug 106 is formed in the dielectric layer 107 and electrically connected to the source/drain regions 105. At least one plug 108 is formed in the dielectric layer 107 and electrically connected to the gate 104. In some embodiments, each of the plugs 106 and 108 includes a metal material (e.g., W, Cu, Al or an alloy thereof) and a diffusion barrier material (e.g., TiW, Ti, TiN, Ta, TaN or a combination thereof) aside and below the metal material, and is formed by suitable processes such as photolithography etching steps followed by plating, chemical vapor deposition (CVD), physical vapor deposition (PVD) and/or the like.

In some embodiments, at least one through substrate via (TSV) 118 is formed through the dielectric layer 107 and extends to a portion of the first substrate 100. In some embodiments, each TSV 118 includes a liner 112 formed on the sidewall and bottom of an opening 110, a diffusion barrier layer 114 formed on the liner 112 and a metal layer 116 filled in the opening 110. The liner 112 is made of an insulating material such as silicon oxide or silicon nitride and formed by a suitable process such as CVD. The diffusion barrier layer 114 is made of Ta, TaN, Ti, TiN or a combination thereof and formed by a suitable process such as CVD or PVD. The metal layer 116 is made of Cu, Al, Ni, Sn or an alloy thereof and formed by a suitable process such as plating or CVD. In some embodiments, each opening 110 has a wide top and a narrow bottom. More specifically, each opening 110 is formed with a tilted sidewall, and the cross-section area of the opening 110 is decreased toward the first backside 10b of the first chip 10. In alternative embodiments, one or more openings 110 have substantially vertical sidewalls. Besides, although FIG. 1A shows one TSV 118 in each first chip 10, the number of the TSV 118 can be adjusted according to the actual application.

Each first chip 10 further includes a plurality of conductive layers (e.g., metal lines) and a plurality of conductive vias (e.g., metal vias) between two adjacent conductive layers and embedded by a dielectric layer. In some embodiments, a metal line 120 is formed over the dielectric layer 107 and electrically connected to the TSV 118 and the plugs 106 and 108. A metal line 124 is electrically connected to the metal line 120 with a plurality of conductive vias 123 embedded by a dielectric layer 122. A metal line 128 is electrically connected to the metal line 124 with a plurality of conductive vias 125 embedded by a dielectric layer 126. A metal line 132 is electrically connected to the metal line 128 with a plurality of conductive vias 131 embedded by a dielectric layer 130.

Herein, when elements are described as "at substantially the same level", the elements are formed at substantially the same height in the same layer, or having the same positions embedded by the same layer. In some embodiments, the elements at substantially the same level are formed from the same material(s) with the same process step(s). In some embodiments, the tops of the elements at substantially the same level are substantially coplanar. For example, in FIG. 1A, conductive vias 123 formed at substantially the same height in the same dielectric layer 122 are described as "at substantially the same level". Similarly, conductive vias 125 formed at substantially the same height in the same dielectric layer 126 are described as "at substantially the same level", and conductive vias 131 formed at substantially the same height in the same dielectric layer 130 are described as "at substantially the same level".

As shown in FIG. 1A, the conductive vias 123 are formed at substantially the same level to electrically connect the metal lines 120 and 124, the conductive vias 125 are formed at substantially the same level to electrically connect the metal lines 124 and 128, and the conductive vias 131 are formed at substantially the same level to electrically connect the metal lines 128 and 132.

In some embodiments, each of the conductive layers (e.g., metal lines) includes a metal material (e.g., Cu, Al or an alloy thereof) and an underlying diffusion barrier material (e.g., TiCu, Ti, TiN, Ta, TaN or a combination thereof) and is formed by a suitable process such as plating or CVD. In some embodiments, each of the conductive vias includes a metal material (e.g., Cu, Al or an alloy thereof) and a diffusion barrier material (e.g., TiCu, Ti, TiN, Ta, TaN or a combination thereof) aside and below the metal material, and is formed by suitable processes such as photolithography etching steps followed by plating, CVD, PVD and/or the like. Besides, the numbers of the conductive layers and conductive vias in FIG. 1A are provided for illustration purposes and are not construed as limiting the present disclosure.

In some embodiments, the dielectric layers include a low dielectric constant (low-k) material, a nitride such as silicon nitride, an oxide such as silicon oxide, undoped silicate glass (USG), phosphosilicate glass (PSG), borosilicate glass (BSG), boron-doped phosphosilicate glass (BPSG), or a combination thereof. In some embodiments, the low-k material has a dielectric constant of less than about 4 or even less than about 3. In some embodiments, the low-k material includes a polymer based material, such as benzocyclobutene (BCB), FLARE®, or SILK®; or a silicon dioxide based material, such as hydrogen silsesquioxane (HSQ) or SiOF. In some embodiments, one or more of the dielectric layers include multiple dielectric materials. Each of the dielectric layers is formed by a suitable process such as spin-coating, CVD and/or the like.

In some embodiments, a first bonding structure 140 is formed over the top metal line 132. In some embodiments, the first bonding structure 140 includes at least one first bonding pad 138 and a dielectric layer 136 aside the first bonding pad 138. In some embodiments, the first bonding pad 138 is embedded in the dielectric layer 136. Specifically, the dielectric layer 136 surrounds the sidewall of the first bonding pad 138. The first bonding pad 138 is electrically connected to the metal line 132 with a plurality of conductive vias 133. Specifically, the conductive vias 133 are formed at substantially the same level to electrically connect the metal line 132 and the first bonding pad 138. In some embodiments, the first bonding pad 138 includes a metal material (e.g., Cu, Al or an alloy thereof) and a diffusion barrier material (e.g., TiCu, Ti, TiN, Ta, TaN or a combination thereof) aside and below the metal material. The first bonding pad 138 is formed by suitable processes such as plating or CVD combined with photolithography etching steps. The dielectric layer 136 includes silicon oxide, benzocyclobutene (BCB) polymer, polyimide (PI), polybenzoxazole (PBO) or a combination thereof and is formed by a suitable process such as spin coating, CVD or the like.

Continue referring to FIG. 1A, a wafer 20 is provided with a plurality of second chip regions 201 arranged in an array. In some embodiments, the wafer 20, in each second chip region 201, includes a second substrate 200, a device layer 202 and an interconnection 206. In some embodiments, the second substrate 200 has a material similar to that of the first substrate 100. In alternative embodiments, the second substrate 200 has a material different from that of the first substrate 100. In some embodiments, the device layer 202 includes at least one gate structure over and/or in the second substrate 200 in an active area. The gate structure contains a gate dielectric layer, a gate, source/drains and possibly spacers. The interconnection 206 including conductive layers and conductive vias therebetween is formed over the device layer 202 and embedded by a dielectric layer 204.

In some embodiments, a second bonding structure 212 is formed over the interconnection 206. In some embodiments, the second bonding structure 212 includes at least one second bonding pad 210 and a dielectric layer 208 aside the second bonding pad 210. In some embodiments, the second bonding pad 210 is embedded in the dielectric layer 208. Specifically, the dielectric layer 208 surrounds the sidewall of the second bonding pad 210. The second bonding pad 210 is electrically connected to the interconnection 206. The second bonding pad 210 is formed by suitable processes such as plating or CVD combined with photolithography etching steps. The dielectric layer 208 includes silicon oxide, benzocyclobutene (BCB) polymer, polyimide (PI), polybenzoxazole (PBO) or a combination thereof and is formed by a suitable process such as spin coating, CVD or the like. In some embodiments, the second bonding pad 210 has a material similar to that of the first bonding pad 138, and the dielectric layer 208 has a material similar to that of the dielectric layer 136. In alternative embodiments, the first and second bonding pads 138 and 210 include different materials, and the dielectric layers 136 and 208 include different materials.

Figure 1B:
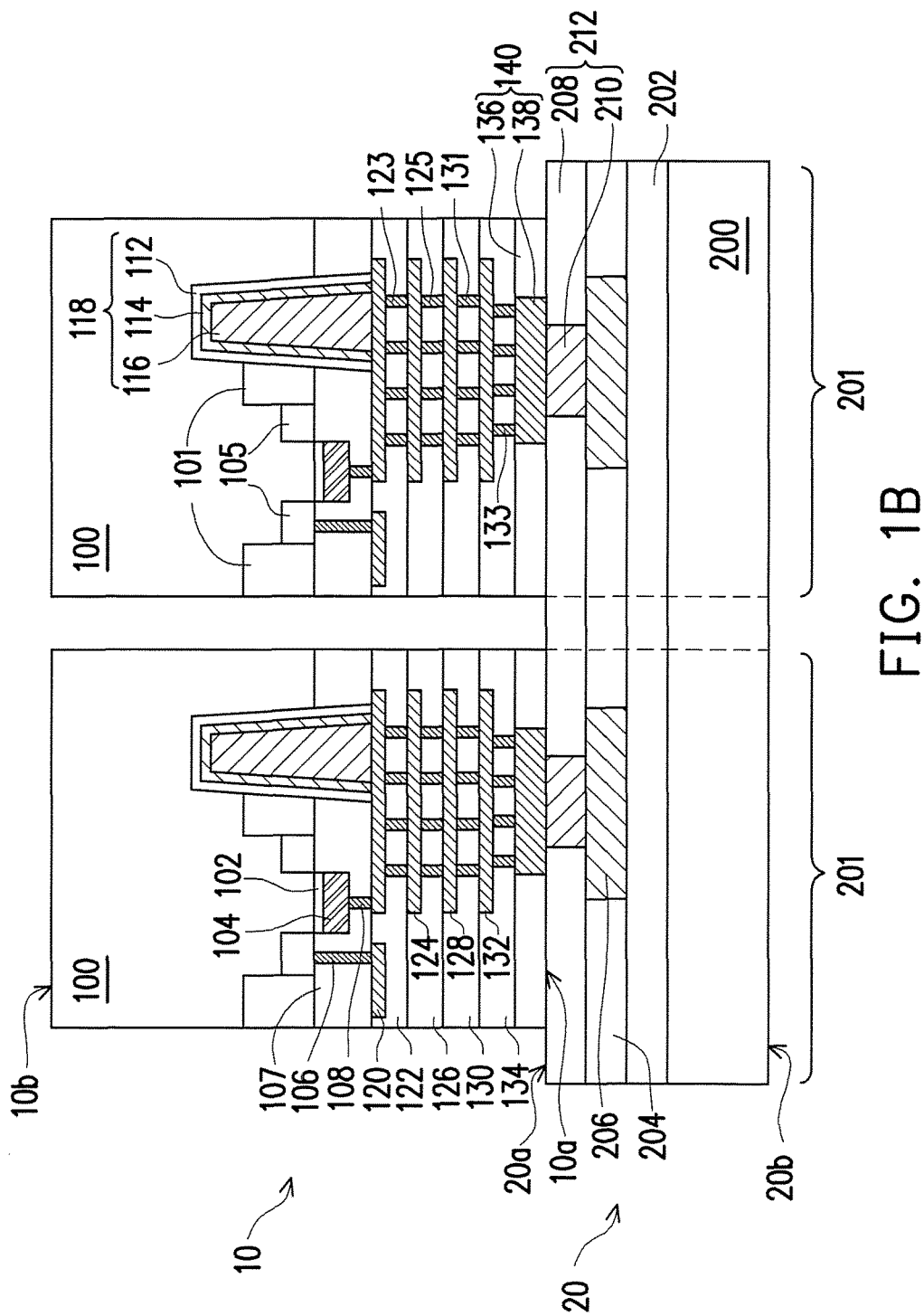

Referring to FIG. 1B, the first chips 10 are turned over and then bonded to the second chip regions 201. In some embodiments, the first chips 10 and the second chip regions 201 are bonded in a face-to-face alignment, wherein the first front sides 10a of the first chips 10 face the second front sides 20a of the wafer 20. The first chips 10 are respectively bonded to the second chip regions 201. Specifically, the first bonding pad 138 of one first chip 10 is aligned and in physical contact with the corresponding second bonding pad 210 of the wafer 20, and the dielectric layer 136 of the same first chip 10 is aligned and in physical contact with the corresponding dielectric layer 208 of the wafer 20. In some embodiments, the dimension of the first bonding pads 138 is less than that of the second bonding pads 210. In alternative embodiments, the dimension of one or more of the first bonding pads 138 is equal to or greater than that of the second bonding pads 210. The first chips 10 and the wafer 20 are heated and/or pressed to enable a metal-to-metal bonding (e.g., copper-to-copper bonding) and a dielectric-to-dielectric bonding (e.g., oxide-to-oxide bonding). Such bonding is called a "hybrid bonding". In some embodiments, the first chips 10 are tested prior to bonding to the second chip regions 201, allowing identification of operable chips for the bonding step.

In some embodiments, the first chips 10 and the second chip regions 201 of the wafer 20 are bonded in a face-to-face alignment with a hybrid bonding as shown in FIG. 1B, but the disclosure is not limited thereto. In alternative embodiments, the first chips 10 and the second chip regions 201 are bonded in a back-to-face alignment or a back-to-back alignment with a hybrid bonding, a fusion bonding, a eutectic bonding or an adhesive bonding upon the actual requirements.

Figure 1C:
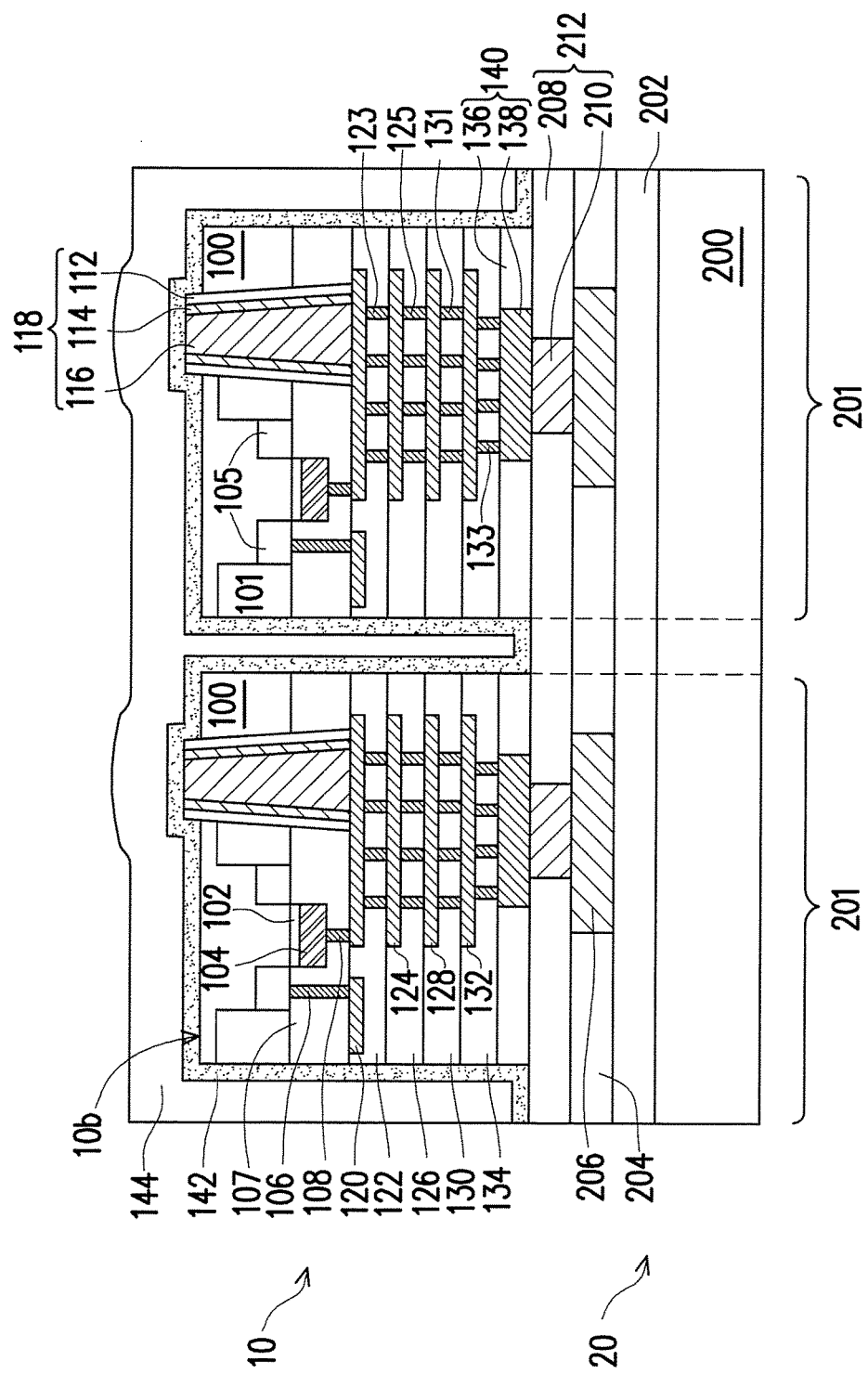

Referring to FIG. 1C, the first chips 10 are thinned to expose upper portions of the TSVs 118 of the first chips 10. In some embodiments, the first substrates 100 are thinned from the first backsides 10b and portions of the first substrates 100 are removed through a suitable grinding process and/or a polishing process such as chemical mechanical polishing (CMP) or the like to reveal the upper portions of the TSVs 118. In some embodiments, portions of the liners 112 and the diffusion barrier layers 114 of the TSVs 118 are simultaneously removed until portions of the metal layers 116 of the TSVs 118 are exposed from the first backsides 10b.

Thereafter, an isolation layer 142 is formed over the first chips 10, covers the backsides 10b and sidewalls of the first chips 10 and covers the exposed portions of the TSVs 118. The isolation layer 142 includes silicon oxide, silicon nitride, silicon oxynitride or a combination thereof and is formed by a suitable process such as CVD. A dielectric layer 144 is then formed over the isolation layer 142 and fills in the gaps between the first chips 10. The dielectric layer 144 includes silicon oxide, silicon nitride, silicon oxynitride, undoped silicate glass (USG), phosphosilicate glass (PSG), borosilicate glass (BSG), boron-doped phosphosilicate glass (BPSG), or a combination thereof and is formed by a suitable process such as spin-coating or CVD. In some embodiments, the isolation layer 142 and the dielectric layer 144 have the same or different materials.

Figure 1D:
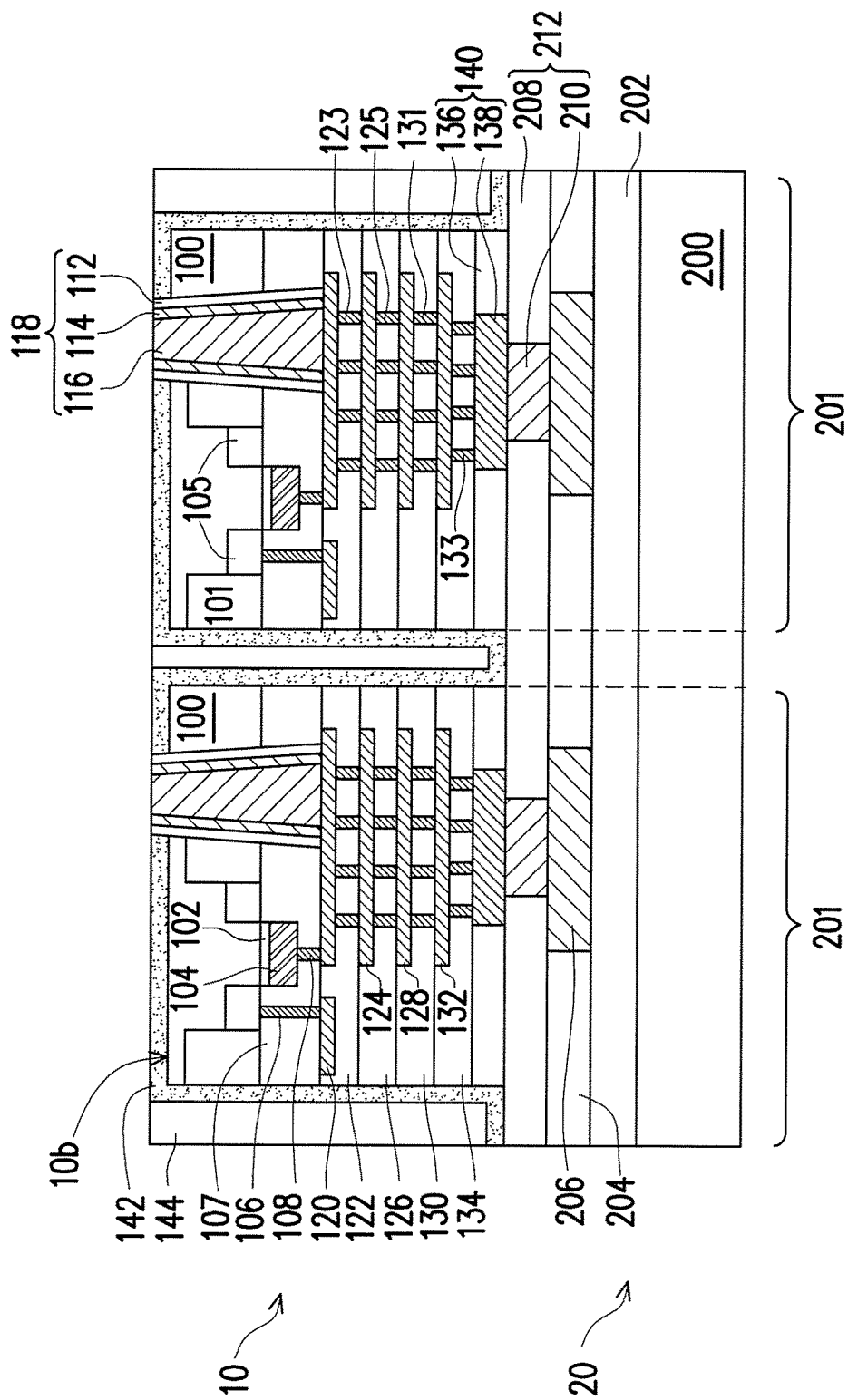

Referring to FIG. 1D, the TSVs 118 of the first chips 10 are exposed. In some embodiments, portions of the isolation layer 142 and the dielectric layer 144 are removed to reveal the metal layers 116 of the TSVs 118 with a suitable process such as CMP. In some embodiments, a wet etching process is performed to remove the defects formed on the first backsides 10b of the first chips 10.

Figure 1E:
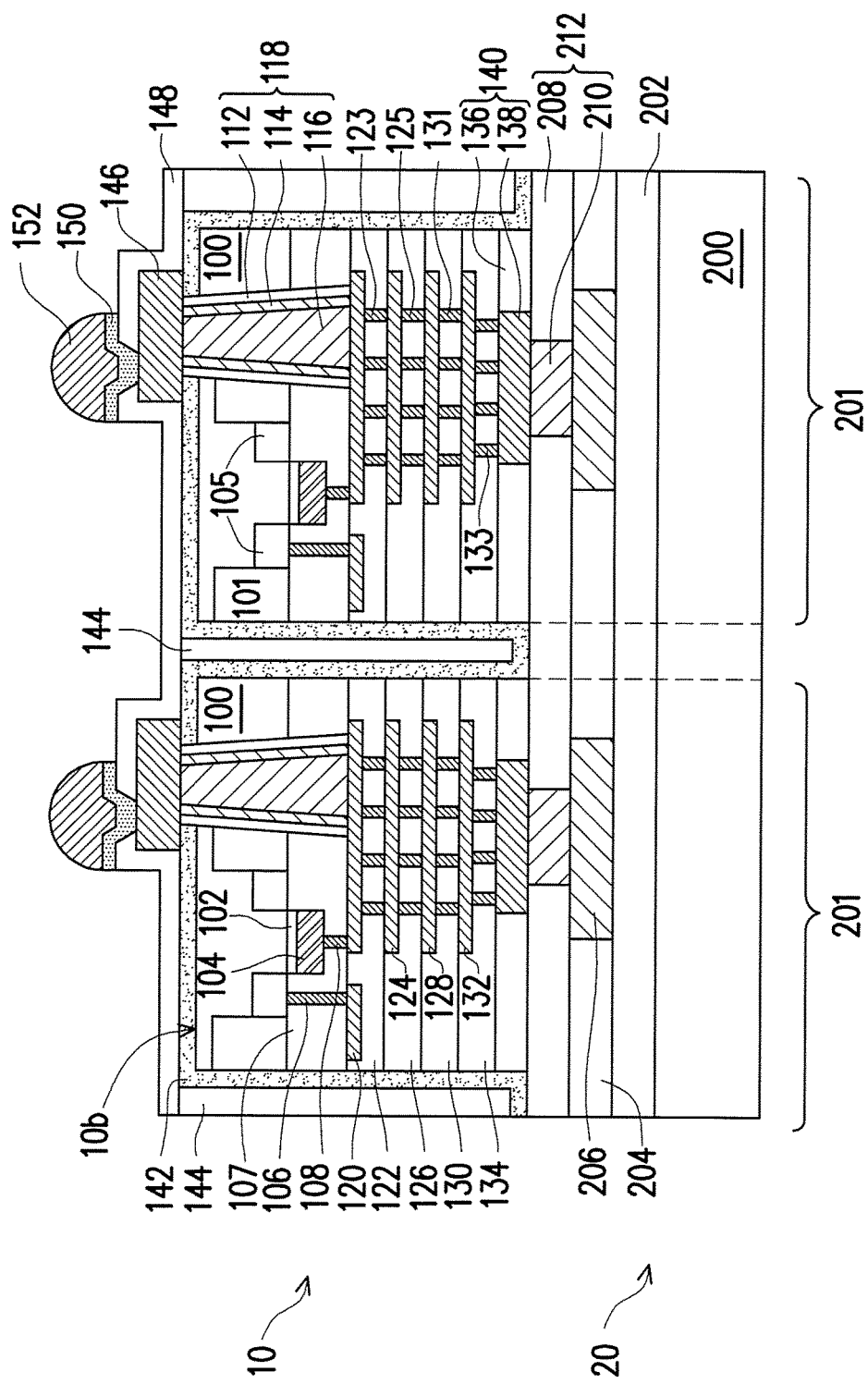

Referring to FIG. 1E, backside metal features 146 are formed over and electrically connected to the TSVs 118. The backside metal features 146 include redistribution layer (RDL) structures and/or pads embedded in a passivation layer 148. Under bump metallization (UBM) layers 150 are formed over the backside metal features 146, and bumps 152 (such as solder balls) are formed or mounted over the UBM layers 150. The bumps 152 are electrically connected to the TSVs 118 with the backside metal features 146. In some embodiments, the UBM layers 150 are made of Ti, TiN, Ta, TaN, or the like and formed by a suitable process such as CVD. In some embodiments, the bumps 152 are made of a conductive material with low resistivity, such as Sn, Pb, Ag, Cu, Ni, Bi or an alloy thereof, and formed by a suitable process such as evaporation, plating, ball drop, or screen printing.

Figure 1F:
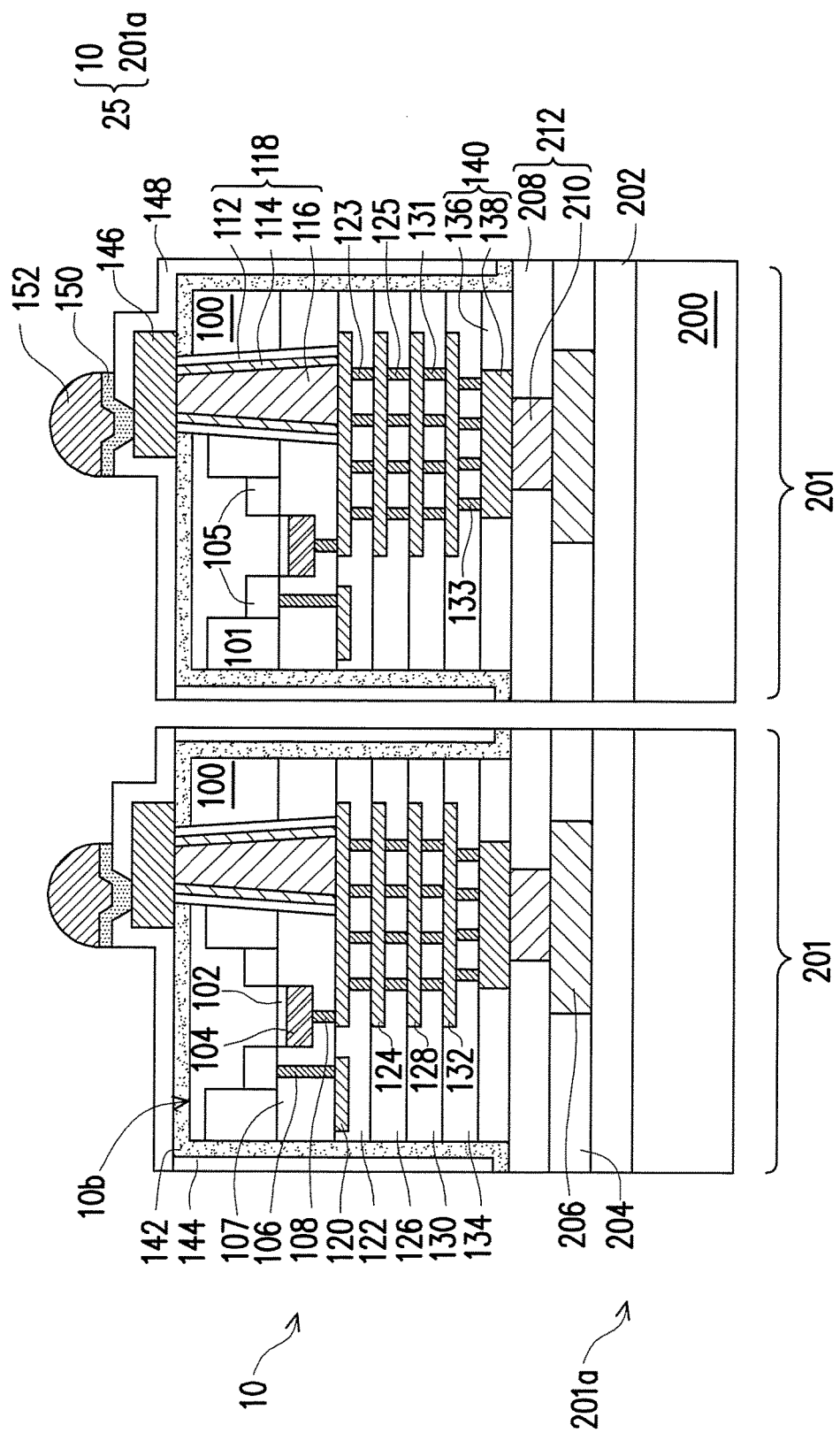

Referring to FIG. 1F, a dicing or singulation process is performed along the scribe regions to form a plurality of separate stacks 25 each including a first chip 10 and a second chip 201a. A cutting machine used for the dicing process typically involves dicing with a rotating blade or a laser beam. In other words, the dicing or singulation process is, for example, a laser cutting process or a mechanical cutting process.

Figure 2:
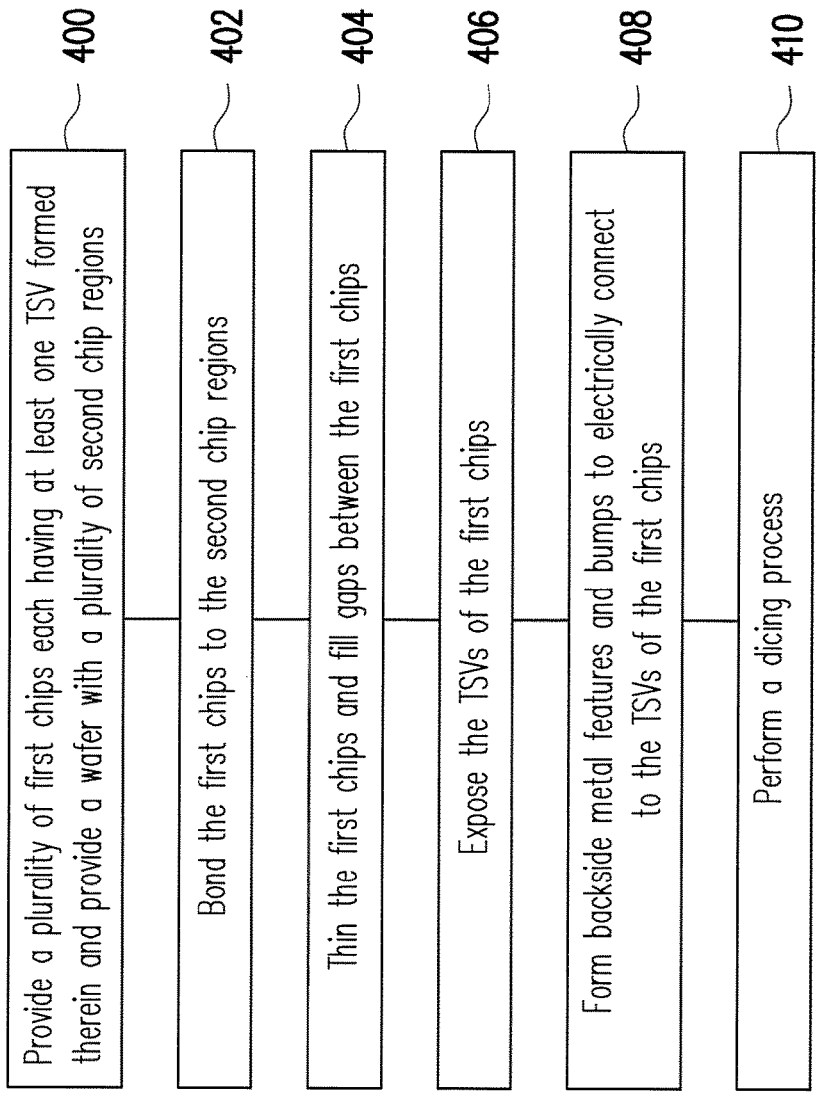
FIG. 2 is a flow chart illustrating a method of forming a 3DIC structure in accordance with some embodiments.

The process steps of FIG. 1A to FIG. 1F can be concisely illustrated with reference to the flow chart of FIG. 2.

At step 400, a plurality of first chips 10 each having at least one TSV 118 formed therein and a wafer 20 with a plurality of second chip regions 201 are provided, as shown in FIG. 1A. At step 402, the first chips 10 are respectively bonded to the second chip regions 201, as shown in FIG. 1B. At step 404, the first chips 10 are thinned and gaps between the first chips 10 are filled, as shown in FIG. 1C. At step 406, the TSVs 118 of the first chips 10 are exposed, as shown in FIG. 1D. At step 408, backside metal features 146 and bumps 152 are formed to electrically connect to the TSVs 118 of the first chips 10, as shown in FIG. 1E. At step 410, a dicing process is performed to form a plurality of separate stacks 25, as shown in FIG. 1F. A 3DIC structure of the disclosure is thus completed.

It is noted that, in the disclosure, the first chips 10 are thinned (step 404) after the step of bonding the first chips 10 to the second chip regions 201 (step 402), and such sequence enables the chips to be thinned more while neither the chip nor the wafer is vulnerable to be damaged or broken during the thinning step.

In some embodiments, the 3DIC structure of the disclosure is as shown in FIG. 1F, in which a first chip 10 is electrically connected to a second chip 201a with a first bonding pad 138 of the first chip 10 and a second bonding pad 206 of the second chip 201a. At least one TSV 118 extends from the first backside 10b of the first chip 10 to a metallization element (e.g., metal line 120) of the first chip 10. Besides, the TSV 118 is electrically connected to the first bonding pad 138 with a plurality of conductive vias (e.g., conductive vias 123, 125, 131 or 133) at substantially the same level. In some embodiments, the current flowing through the TSV 118 is sequentially distributed or spread to multiple conductive vias 123, 125, 131 and 133 at different levels, all of which are electrically connected to the first bonding pad 138. Such configuration is beneficial to uniformly distribute or spread the current from the TSV 118 to multiple conductive vias and therefore the first bonding pad 138, so the device reliability is greatly improved.

FIG. 5 to FIG. 10 are local top views of conductive vias and the adjacent conductive layers of a 3DIC structure in accordance with some embodiments.

In some embodiments, from a top view of FIG. 5, the conductive vias 123, 125, 131 or 133 at substantially the same level are provided in a dot or pillar form and arranged in an array, so as to uniformly distribute the current from the corresponding TSV 118 to the corresponding second chip 201*a*. In some embodiments, the pillar-shaped conductive vias 123, 125, 131 or 133 at substantially the same level are separated from each other. In some embodiments, the conductive vias 123, 125, 131 or 133 have substantially the same size or top area, as shown in FIG. 5. In alternative embodiments, the conductive vias 123, 125, 131 or 133 have different sizes or top areas upon the process requirements.

In some embodiments, the conductive vias 123, 125, 131 or 133 at substantially the same level are provided in a slot or stripe form for distributing the current from the corresponding TSV 118 to the corresponding second chip 201*a* more stably and uniformly, as shown in top views of FIG. 6 to FIG. 9. In some embodiments, the stripe-shaped conductive vias 123, 125, 131 or 133 are separated from each other. For example, the conductive vias 123, 125, 131 or 133 are formed as walls substantially parallel to each other, as shown in FIG. 6. In alternative embodiments, at least a portion of the stripe-shaped conductive vias 123, 125, 131 or 133 are connected, as shown in FIG. 7 to FIG. 9. In some embodiments, the conductive vias 123, 125, 131 or 133 are connected to form a fence-like structure, a checkboard-like structure or a mesh-like structure, as shown in FIG. 7. In some embodiments, the conductive vias 123, 125, 131 or 133 are formed as concentric rings, such as concentric circular rings as shown in FIG. 8 or concentric square rings as shown in FIG. 9.

From another point of view, the conductive vias 123, 125, 131 and 133 are electrically connected between the TSV 118 and the first bonding pad 138, and an elongated slot or a closed space is between at least two of the conductive vias 123, 125, 131 and/or 133. In some embodiments, at least one elongated slot is between the conductive vias 123, 125, 131 and/or 133, as shown in FIG. 6. In some embodiments, at least one closed space is between the conductive vias 123, 125, 131 and/or 133, as shown in FIG. 7 to FIG. 10. Specifically, at least one closed rectangular space or elongated slot is within the conductive vias 123, 125, 131 and/or 133, as shown in FIG. 7 and FIG. 10. In some embodiments, the conductive vias 123, 125, 131 and/or 133 as shown in FIG. 7 can be described as one non-solid conductive via having a fence shape, a checked shape or a mesh shape. At least one closed ring space is between the conductive vias 123, 125, 131 and/or 133, as shown in FIG. 8 and FIG. 9. In some embodiments, a dielectric material of the dielectric layers 122, 126, 130 and/or 134 filling the elongated slot or the closed space between the at least two of the conductive vias 123, 125, 131 and/or 133. In some embodiments, a dielectric material of the dielectric layers 122, 126, 130 and/or 134 filling at least one elongated slot or closed space within at least one conductive via 123, 125, 131 and/or 133.

The embodiments in which the conductive vias are pillars, walls, fences or rings are provided merely for illustration purposes, and are not construed as limiting the scope of the present disclosure. In alternative embodiments, other shaped conductive vias or a combination of at least two of the pillars, walls fences and rings are applicable to the present disclosure. In some embodiments, the conductive vias include at least one ring and a plurality of pillars, as shown in FIG. 10, in which the pillar-shaped conductive vias are formed aside or around the ring-shaped conductive via.

It is appreciated by people having ordinary skill in the art that other combinations and configurations of the conductive vias are possible. In some embodiments, the conductive vias are provided evenly in the region corresponding to the TSV. In alternative embodiments, the conductive vias are provided randomly and unevenly in the region corresponding to the TSV. In other words, the shapes, sizes, variations, configurations and distributions of the conductive vias are not limited by the present disclosure.

The conductive vias are contemplated as falling within the spirit and scope of the present disclosure as long as the conductive vias are formed at substantially the same level or height and help to uniformly distribute or spread the current from one conductive element to another conductive element or from one chip to another chip. By such disposition, the current distribution is uniform and stable, and the device reliability is accordingly improved.

FIG. 3A to FIG. 3F are cross-sectional views of a method of forming a 3DIC structure in accordance with some embodiments. FIG. 4 is a flow chart illustrating a method of forming a 3DIC structure in accordance with some embodiments. The difference between the method of FIG. 3A to FIG. 3F and the method of FIG. 1A to FIG. 1F lies in the timing of forming the TSVs. Specifically, in the method of FIG. 1A to FIG. 1F, at least one TSV 118 is formed in each first chip 10 (step 400, FIG. 1A) prior to the step of bonding the first chips 10 to the second chip regions 201 of the wafer 20 (step 402, FIG. 1B), while in the method of FIG. 3A to FIG. 3F, at least one TSV 308 is formed in each first chip 30 (step 506, FIG. 3D) after the step of bonding the first chips 30 to the second chip regions 201 (step 502, FIG. 3B). In some embodiments, the method of FIG. 1A to FIG. 1F is called a "TSV first" process, while the method of FIG. 3A to FIG. 3F is called a "TSV last" process. The difference is illustrated in details below, and the similarity is not iterated herein.

Figure 3A:
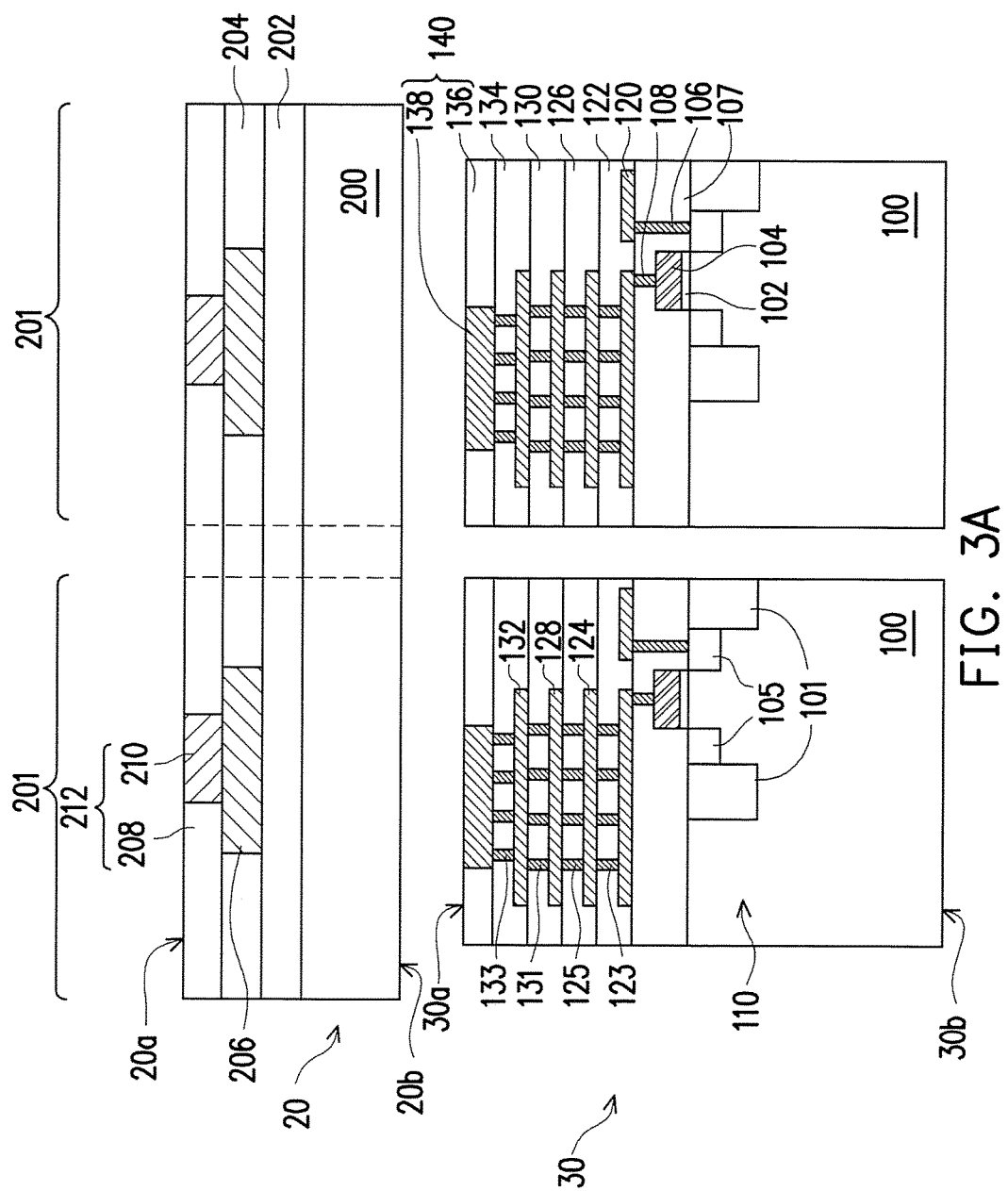
FIG. 3A to FIG. 3F are cross-sectional views of a method of forming a 3DIC structure in accordance with alternative embodiments.
Figure 4:
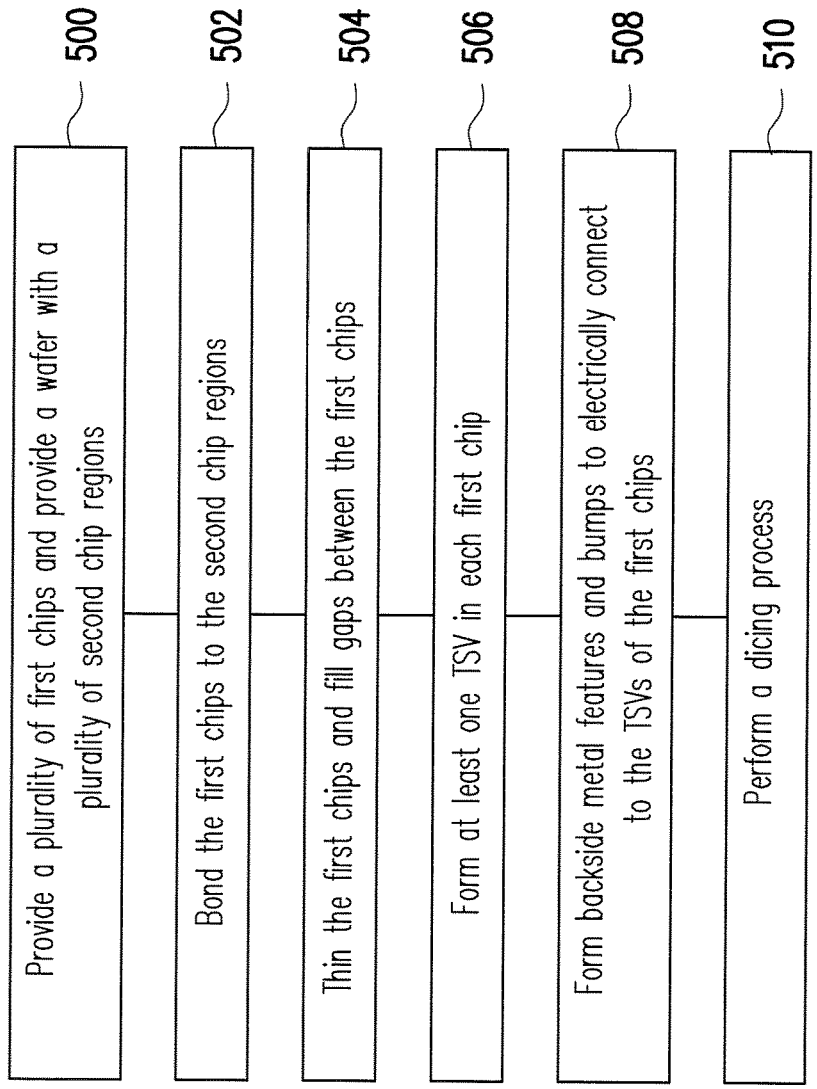
FIG. 4 is a flow chart illustrating a method of forming a 3DIC structure in accordance with alternative embodiments.

Referring to FIG. 3A and FIG. 4, a plurality of first chips 30 and a wafer 20 with a plurality of second chip regions 201 are provided (step 500). The first chips 30 are similar to the first chips 10 but the first chips 30 have no TSV formed therein.

Figure 3B:
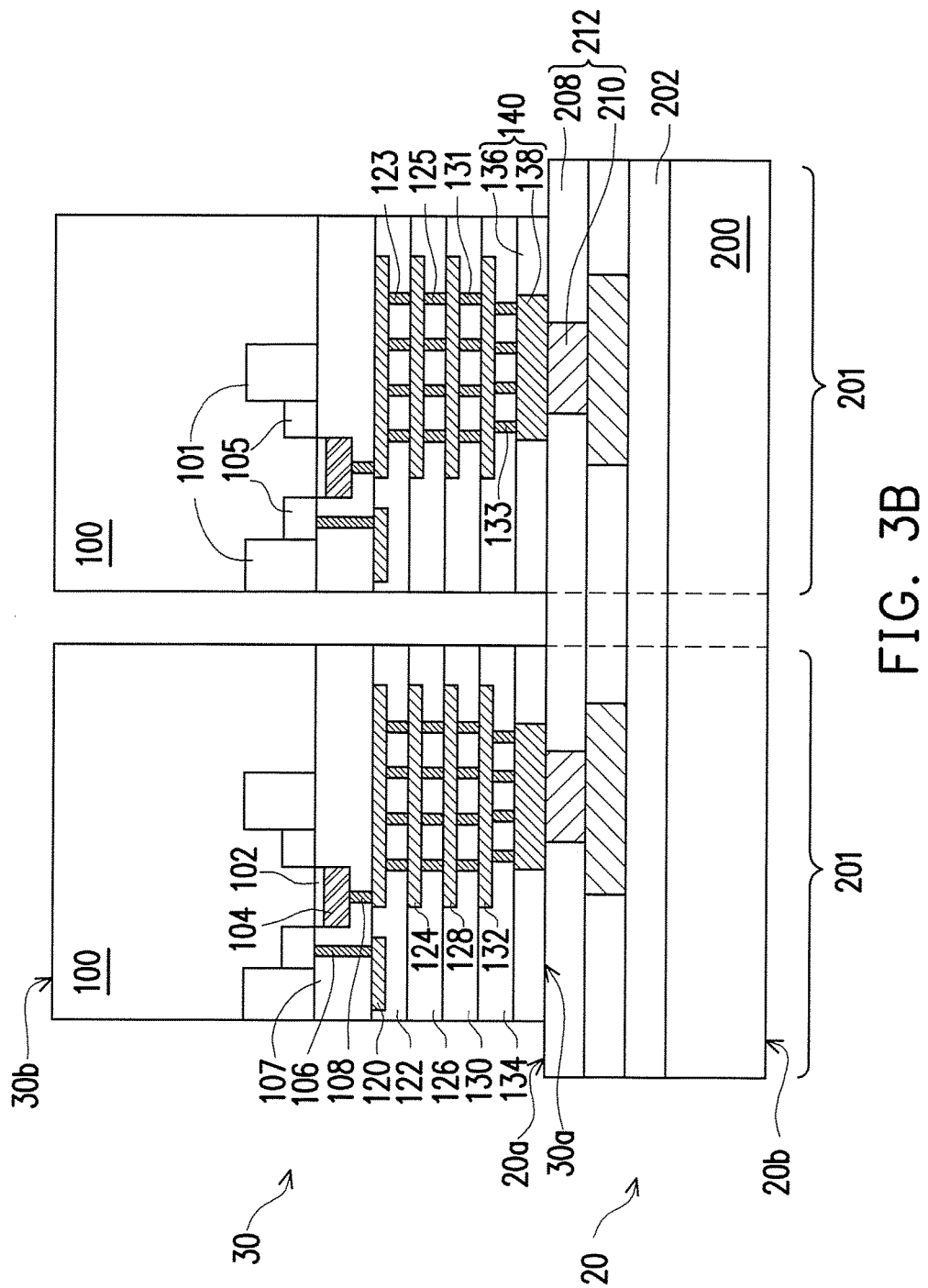

Referring to FIG. 3B and FIG. 4, the first chips 30 are respectively bonded to the second chip regions 201 (step 502). The bonding step 502 is similar to the bonding step 402, so the details thereof are not iterated herein. In some embodiments, the first chips 30 and the second chip regions 201 are bonded in a face-to-face alignment, but the disclosure is not limited thereto.

Figure 3C:
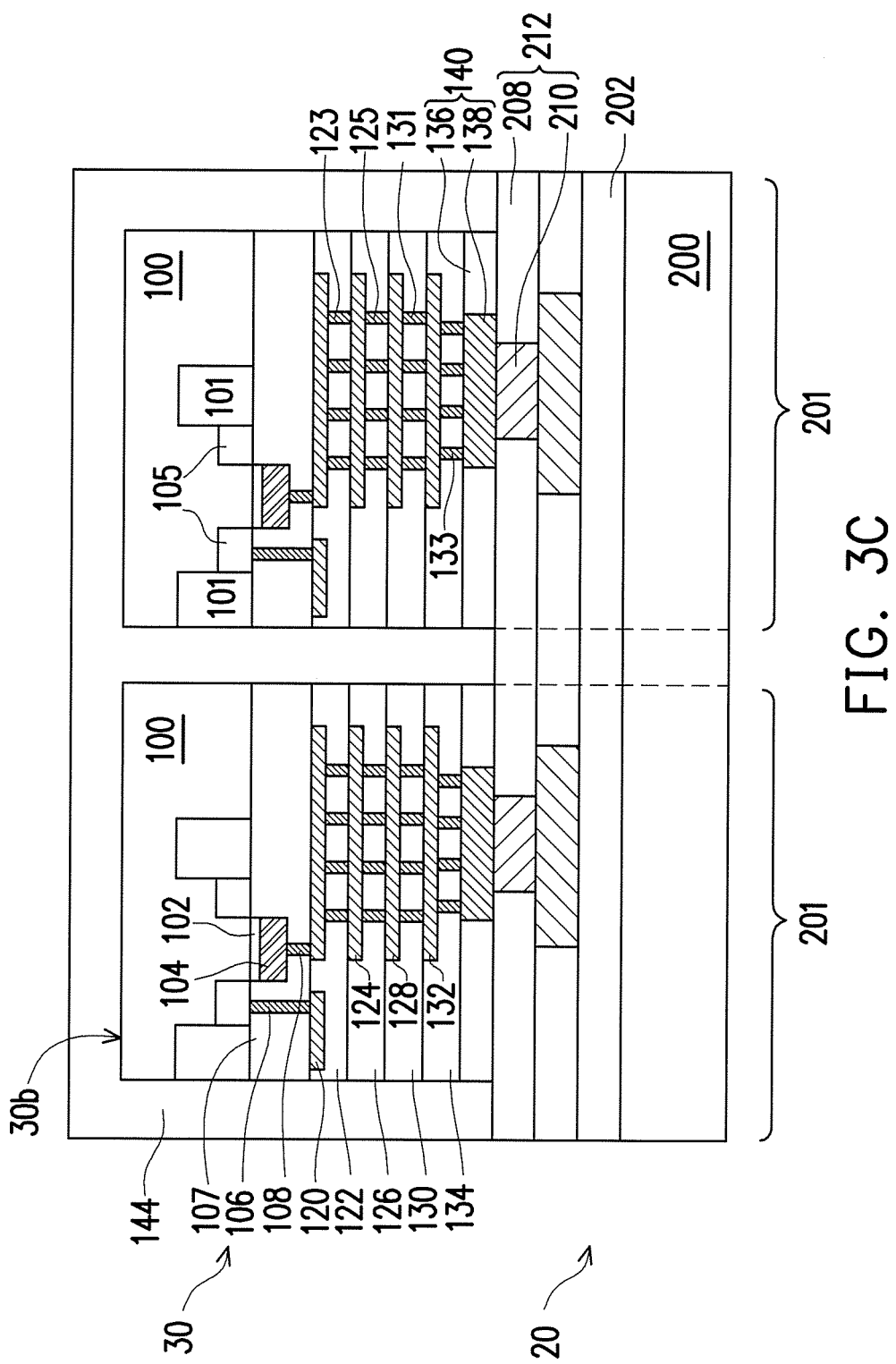

Referring to FIG. 3C and FIG. 4, the first chips 30 are thinned and gaps between the first chips 30 are filled (step 504). In some embodiments, the first chips 30 are thinned from the first backsides 30*b* and portions of the first substrates 100 are removed through a suitable grinding process and/or a polishing process such as CMP or the like. Thereafter, a dielectric layer 144 is formed over the first backsides 30*b* of the first chips 30 and fills in the gaps between the first chips 30. The dielectric layer 144 includes silicon oxide, silicon nitride, silicon oxynitride, undoped silicate glass (USG), phosphosilicate glass (PSG), borosilicate glass (BSG), boron-doped phosphosilicate glass (BPSG), or a combination thereof and is formed by a suitable process such as spin-coating or CVD.

Figure 3D:
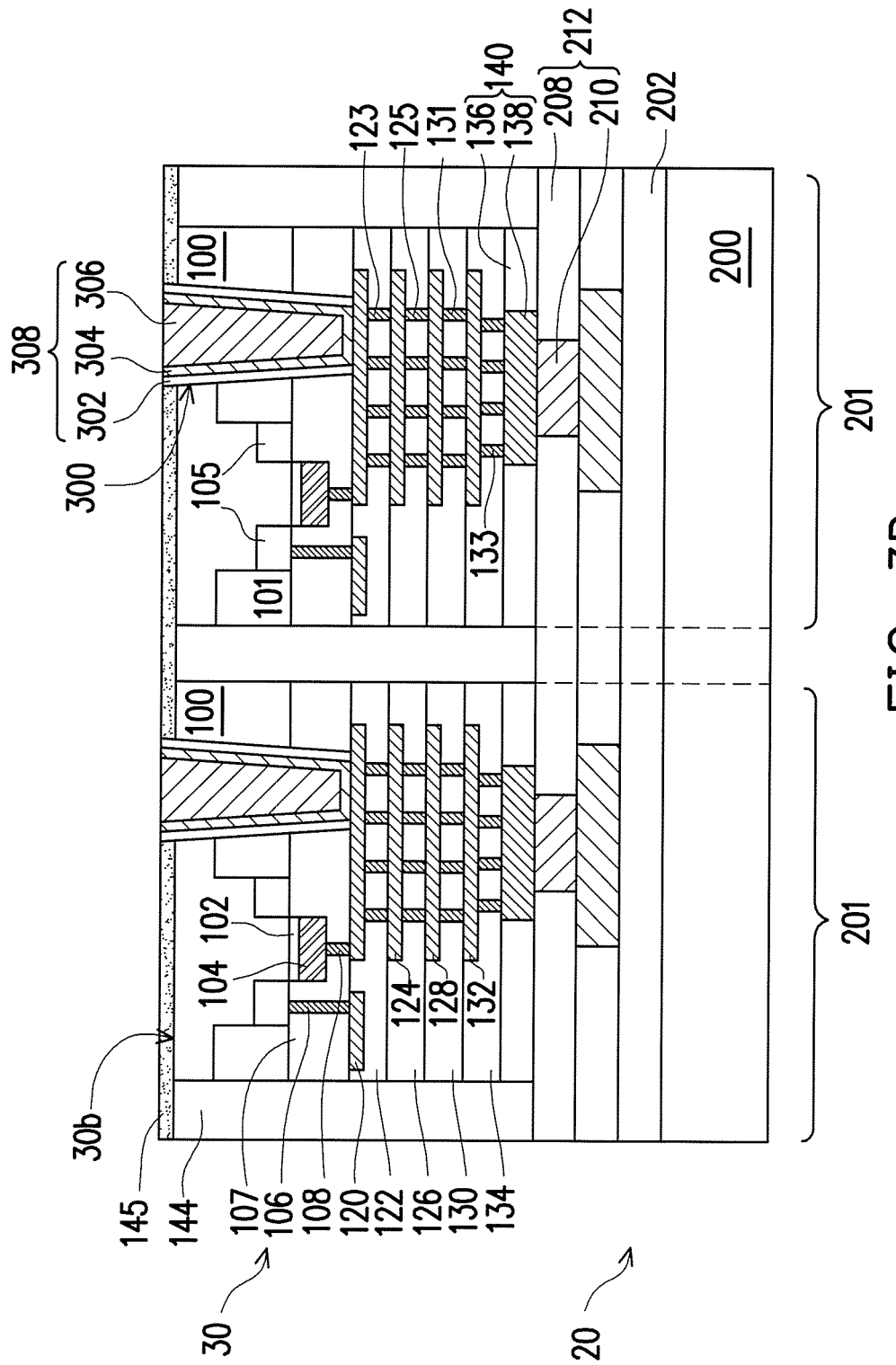

Thereafter, a portion of the dielectric layer 144 is removed with a suitable process such as CMP until the first backsides 30b of the first chips 30 are exposed, as shown in FIG. 3D. In some embodiments, an isolation layer 145 is formed over the dielectric layer 144 and covers the backsides 30b of the first chips 30. The isolation layer 145 includes silicon oxide, silicon nitride, silicon oxynitride or a combination thereof and is formed by a suitable process such as CVD. In some embodiments, the isolation layer 145 and the dielectric layer 144 have different polishing or grinding selectivities.

Referring to FIG. 3D and FIG. 4, at least one TSV 308 is formed in each first chip 30 (step 506). In some embodiments, at least one TSV 308 is formed through the first substrate 100 and the dielectric layer 107 and is landed on the metal line 120. In some embodiments, an etching process is performed to define an opening 300 by using the metal line 120 as an etching stop layer, and the TSV 308 is then formed in the opening 300. In some embodiments, each TSV 308 includes a liner 302 formed on the sidewall of an opening 300, a diffusion barrier layer 304 formed over the liner 302, and a metal layer 306 filled in the opening 300. Specifically, the diffusion barrier layer 304 is formed aside or surrounding the sidewall of the metal layer 306 and between the metal layer 306 and the metal line 120. The liner 302 is made of an insulating material such as silicon oxide or silicon nitride and formed by a suitable process such as CVD. The diffusion barrier layer 304 is made of Ta, TaN, Ti, TiN or a combination thereof and formed by a suitable process such as CVD or PVD. The metal layer 306 is made of Cu, Al, Ni, Sn or an alloy thereof and formed by a suitable process such as plating or CVD. In some embodiments, each opening 300 has a wide top and a narrow bottom. More specifically, each opening 300 is formed with a tilted sidewall, and the cross-section area of the opening 300 is increased toward the first backside 30b of the first chip 30. In alternative embodiments, one or more openings 300 have substantially vertical sidewalls. Besides, although FIG. 3D shows one TSV 308 in each first chip 30, the number of the TSV 308 can be adjusted according to the actual application.

Figure 3E:
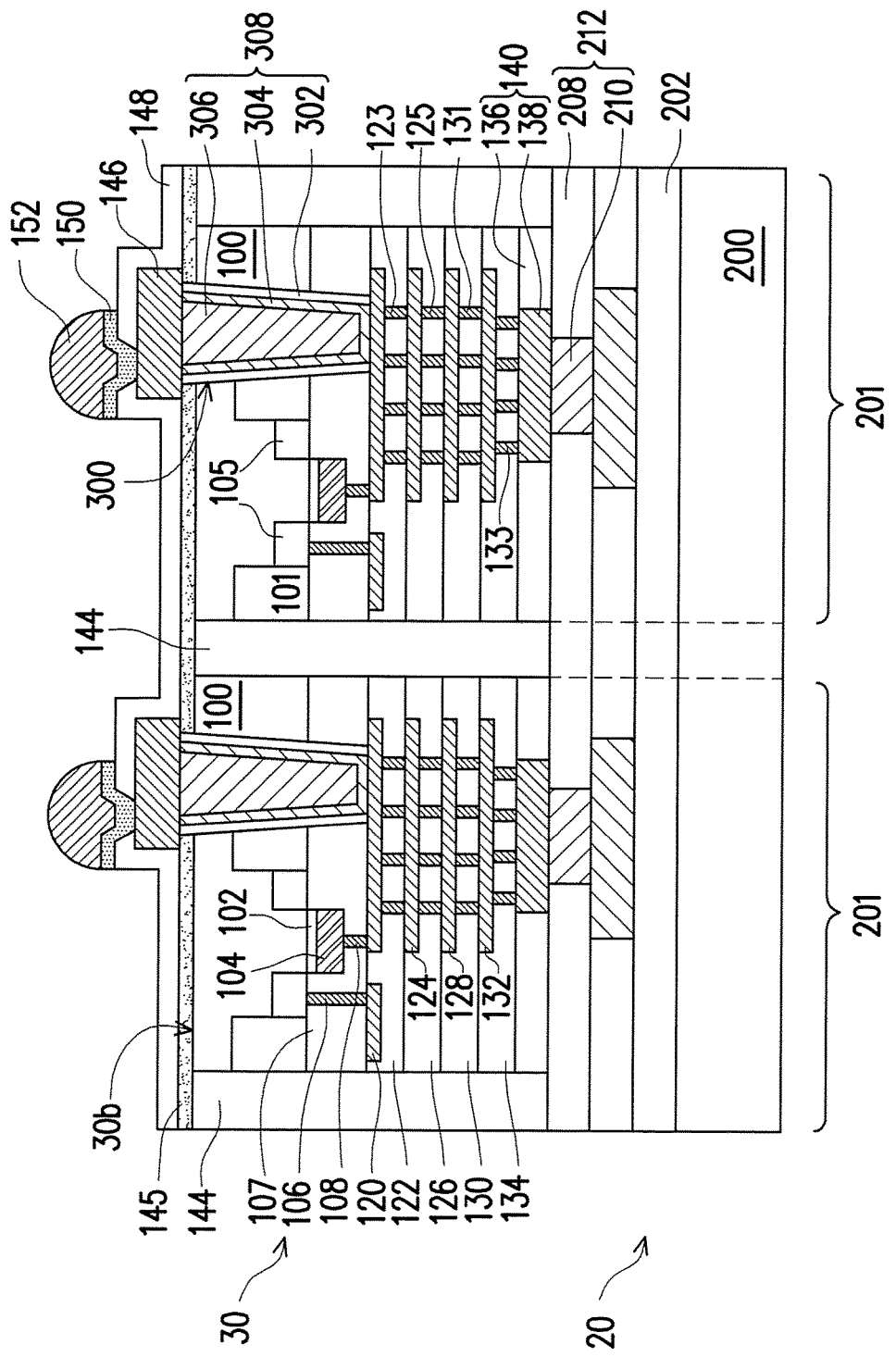

Referring to FIG. 3E and FIG. 4, backside metal features 146 and bumps 152 are formed to electrically connect to the TSVs 308 of the first chips 30 (step 508).

Figure 3F:
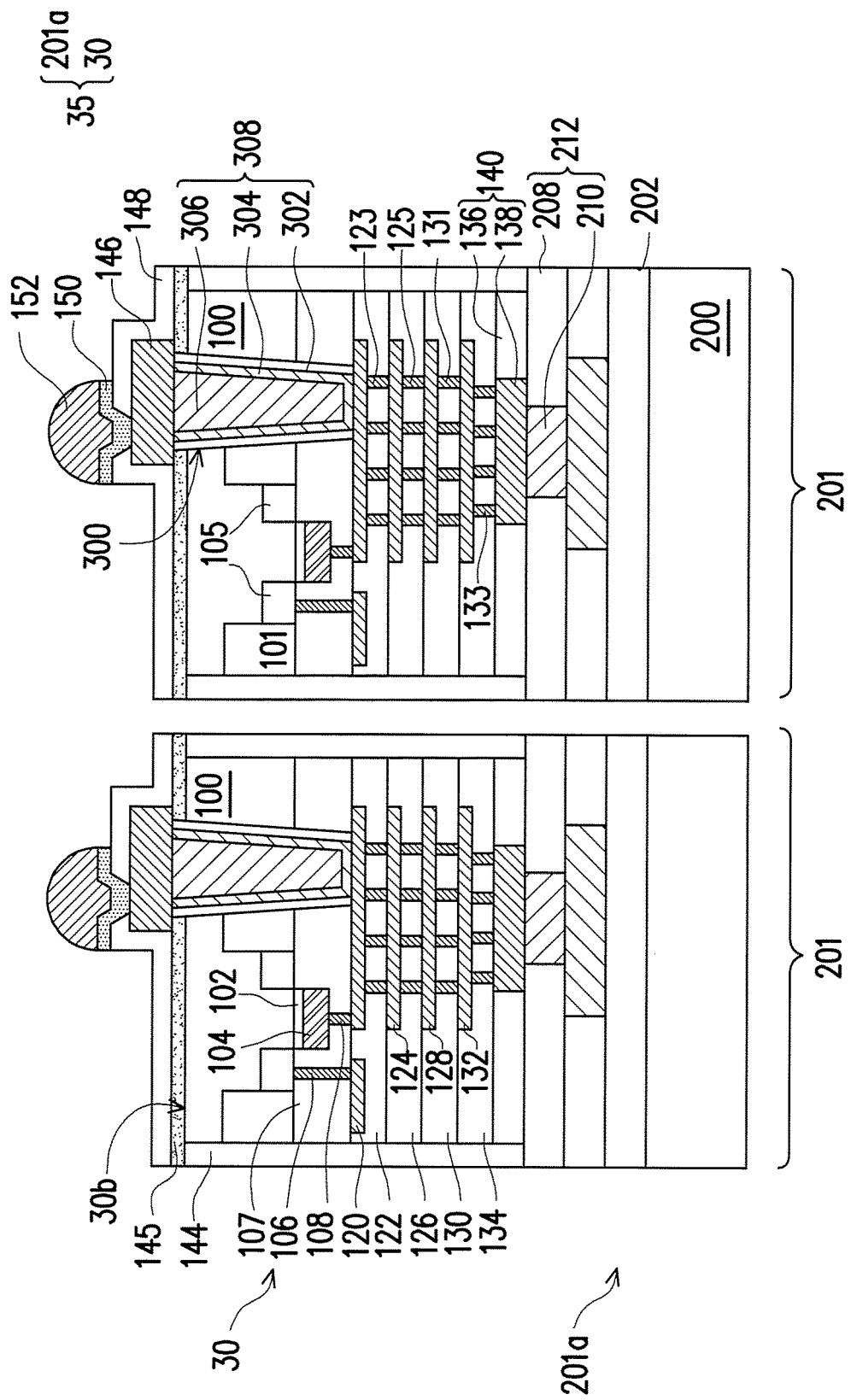

Referring to FIG. 3F and FIG. 4, a dicing process is performed to form a plurality of separate stacks 35 each including a first chip 30 and a second chip 201a (step 510). A 3DIC structure of the disclosure is thus completed.

The 3DIC structure of FIG. 3F is similar to that of FIG. 1F, and the difference between them lies in the shapes of the TSVs and the dispositions of the diffusion barrier layers. Specifically, in the 3DIC structure of FIG. 1F, the area of the TSV 118 exposed by the first backside 10b is smaller than the area of the TSV 118 contacting the metallization element (e.g., metal line 120) of the first chip 10, while in the 3DIC structure of FIG. 3F, the area of the TSV 308 exposed by the first backside 30b is greater than the area of the TSV 308 contacting the metallization element (e.g., metal line 120) of each first chip 30. Besides, the diffusion barrier layer 114 of FIG. 1F is merely disposed between the metal layer 116 and the liner 112, while the diffusion barrier layer 304 of FIG. 3F is disposed aside the metal layer 306 and between the metal layer 306 and the metallization element (e.g., metal line 120) of the first chip 30.

It is noted that, in the embodiments, although the first and second chips are stacked and bonded to form a chip-on-wafer (COW) configuration, such configuration is not intended to limit the embodiments of the present disclosure in any way. In some embodiments, the stacks may have a chip-to-chip or die-to-die bonding configuration or a wafer-to-wafer bonding configuration.

FIG. 11 to FIG. 14 are cross-sectional views of 3DIC structures in accordance with some embodiments.

Figure 11:
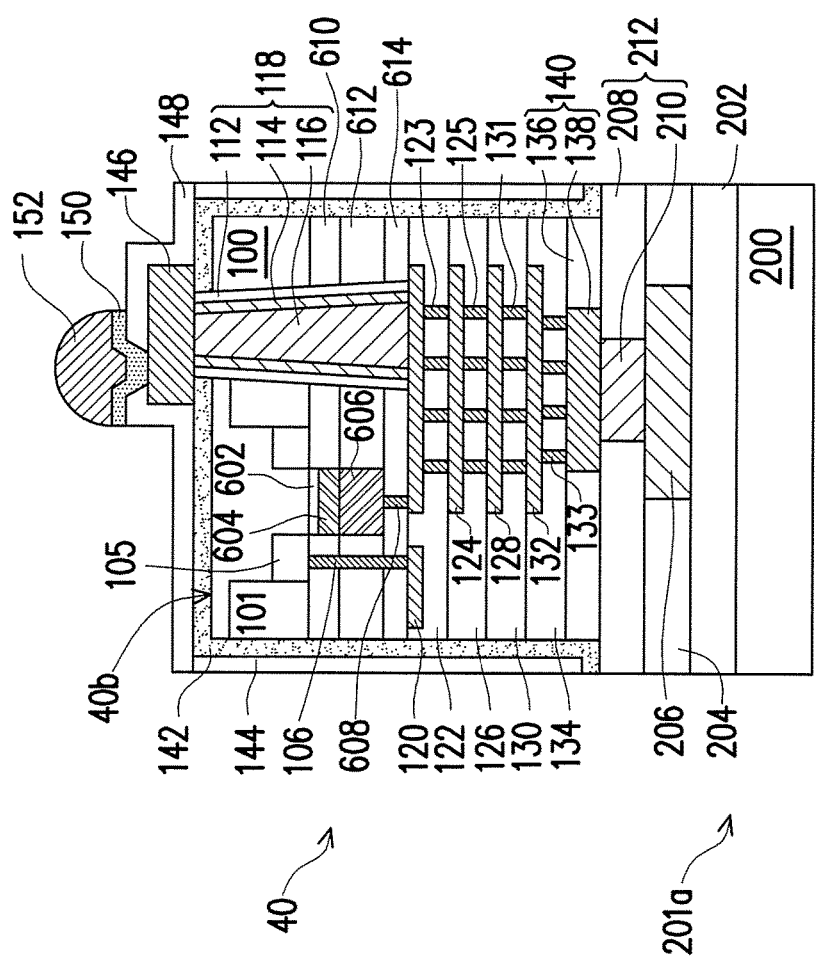
FIG. 11 to FIG. 14 are cross-sectional views of 3DIC structures in accordance with some embodiments.

The 3DIC structure of FIG. 11 is similar to that of FIG. 1F, and the difference between them lies in that the 3DIC structure of FIG. 11 has a gate configuration different from that of the 3DIC structure of FIG. 1F. Specifically, the gate 104 of each chip 10 in FIG. 1F is a metal gate or a polysilicon gate, while the gate of each chip 40 in FIG. 11 is a composite gate including a first gate 604 contacting a gate dielectric layer 602 and at least one second gate 606 contacting the first gate 604. In some embodiments, the first gate 604 is embedded by a dielectric layer 610, the second gate 606 is embedded by a dielectric layer 612, and a dielectric layer 614 is formed covering the second gate 606.

The first gate 604 and the second gate 606 are made of different materials. In some embodiments, the first gate 604 is a metal gate and the second gate 606 is a polysilicon gate. In alternative embodiments, the first gate 604 is a polysilicon gate and the second gate 606 is a metal gate. In some embodiments, the first gate 604 and the second gate 606 have substantially the same dimension, and the borderline of the first gate 604 is aligned with that of the second gate 606. In alternative embodiments, the first gate 604 has a dimension greater than that of multiple second gates 606, and the second gates 606 are formed as separate islands over the first gate 604.

Besides, at least one conductive via 608 is formed in the dielectric layer 614 and electrically connected to the second gate 606. The material and forming method of the conductive via 608 are similar to those of the plug 108, and the details thereof are not iterated herein. In some embodiments, multiple conductive vias 608 can be included in each first chip 40, and they can be provided with one of the designs as shown in FIG. 5 to FIG. 10 to better distribute the current from one conductive element to another conductive element, such as from the metal line 120 to the second gate 606. The TSV 118 is formed through the first substrate 100 and the dielectric layers 610, 612 and 614 and is landed on the metal line 120.

Figure 12:
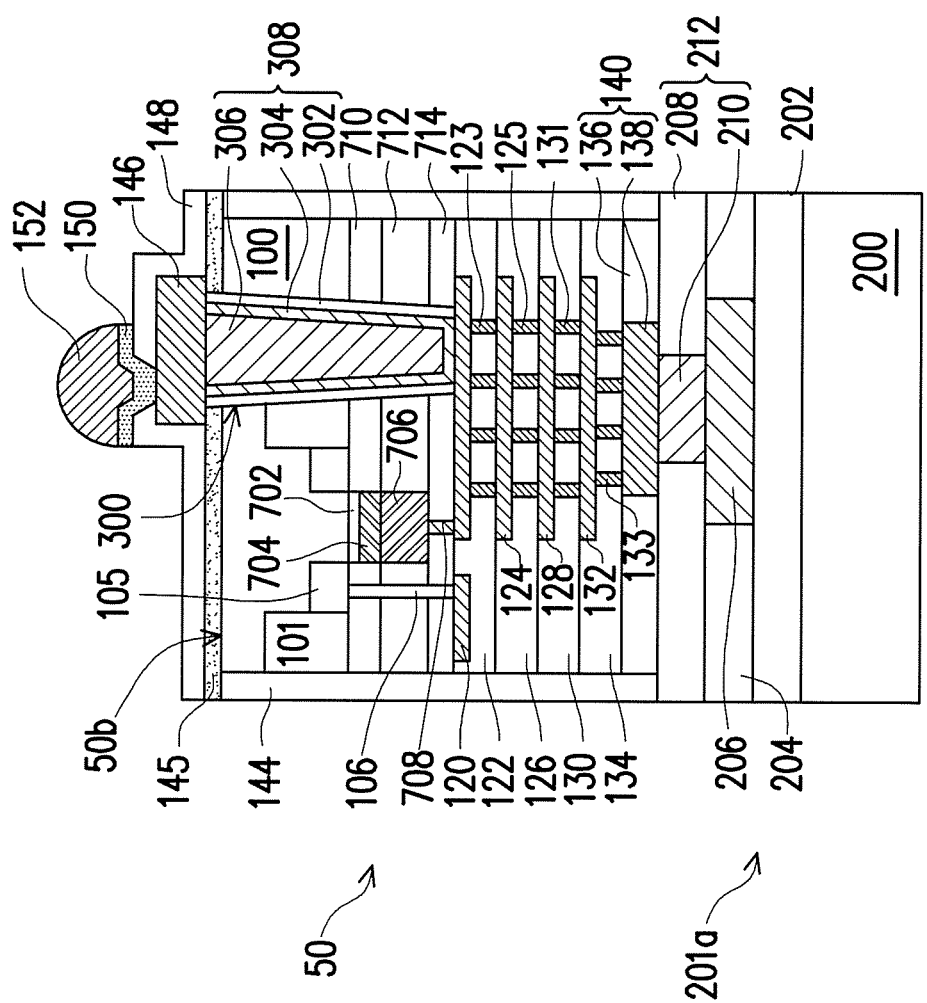

The 3DIC structure of FIG. 12 is similar to that of FIG. 11, and the difference between them lies in that the structure of FIG. 12 is formed by a "TSV last" process while the structure of FIG. 11 is formed by a "TSV first" process. Therefore, their TSV shapes are different. The gate dielectric layer 702, first gate 704, second gate 706, at least one conductive via 708 and dielectric layers 710 to 714 included in each first chip 50 are similar to the gate dielectric layer 602, first gate 604, second gate 606, at least one conductive via 608 and dielectric layers 610 to 614 included in each first chip 40, and the details thereof are not iterated herein.

Figure 13:
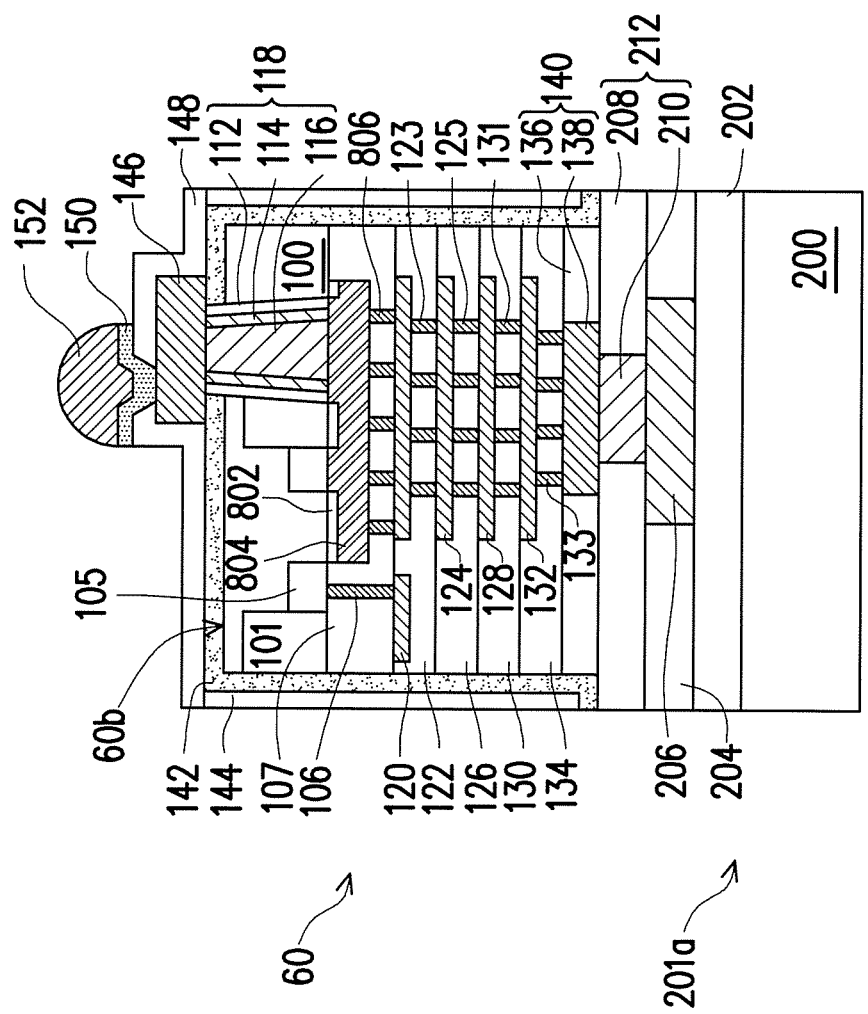

The 3DIC structure of FIG. 13 is similar to that of FIG. 1F, and the difference between them lies in the forming order of the TSV and the gate. Specifically, in the method of forming the structure of FIG. 1F, at least one TSV 118 is formed in each first chip 10 after the step of forming the gate 104, while in the method of forming the structure of FIG. 13, at least one TSV 118 is formed in each first chip 60 prior to the step of forming the metal gate 804.

In some embodiments, the metal gate 804 is formed to extend in a lateral direction, so the TSV 118 is landed on and electrically connected to the metal gate 804. The metal gate 804 includes metal, metal alloy, metal silicide or a combination thereof. In some embodiments, a high-k layer 802 is formed between the source/drain regions 105, between the first substrate 100 and the metal gate 804 and aside or around the TSV 118. In some embodiments, the high-k layer 802 includes a high-k material with a dielectric constant of greater than about 4 or even greater than about 10. In some embodiments, the high-k material includes metal oxide, such as titanium oxide ($TiO_2$), zirconium oxide ($ZrO_2$), hafnium oxide ($HfO_2$), tantalum oxide ($Ta_2O_5$), and barium and strontium titanium oxide (($Ba,Sr$)$TiO_3$) or a combination thereof. In some embodiments, an interfacial layer made of silicon oxide is formed between the high-k layer 802 and the metal gate 804.

In some embodiments, the first chip 60 further includes a plurality of stripe-shaped conductive vias 806 electrically connected between the metal gate 804 and a conductive layer (e.g., metal line 120) the closest to the metal gate 804.

Besides, the conductive vias 806 are formed in the dielectric layer 107 and electrically connected to the metal gate 804. In some embodiments, a metal line 120 is electrically connected to the metal gate 804 with a plurality of conductive vias 806 embedded by a dielectric layer 107. Specifically, the conductive vias 806 are formed at substantially the same level to electrically connect the metal line 120 and the metal gate 804. The material and forming method of the conductive vias 806 are similar to those of the plug 108, and the details are not iterated herein. In some embodiments, the conductive vias 806 can be provided with one of the designs as shown in FIG. 5 to FIG. 10 to better distribute the current from the TSV 118 to another conductive element such as the first bonding pad 138 of the first chip 60. The TSV 118 is formed through the first substrate 100 and is landed on the metal gate 804.

Figure 14:
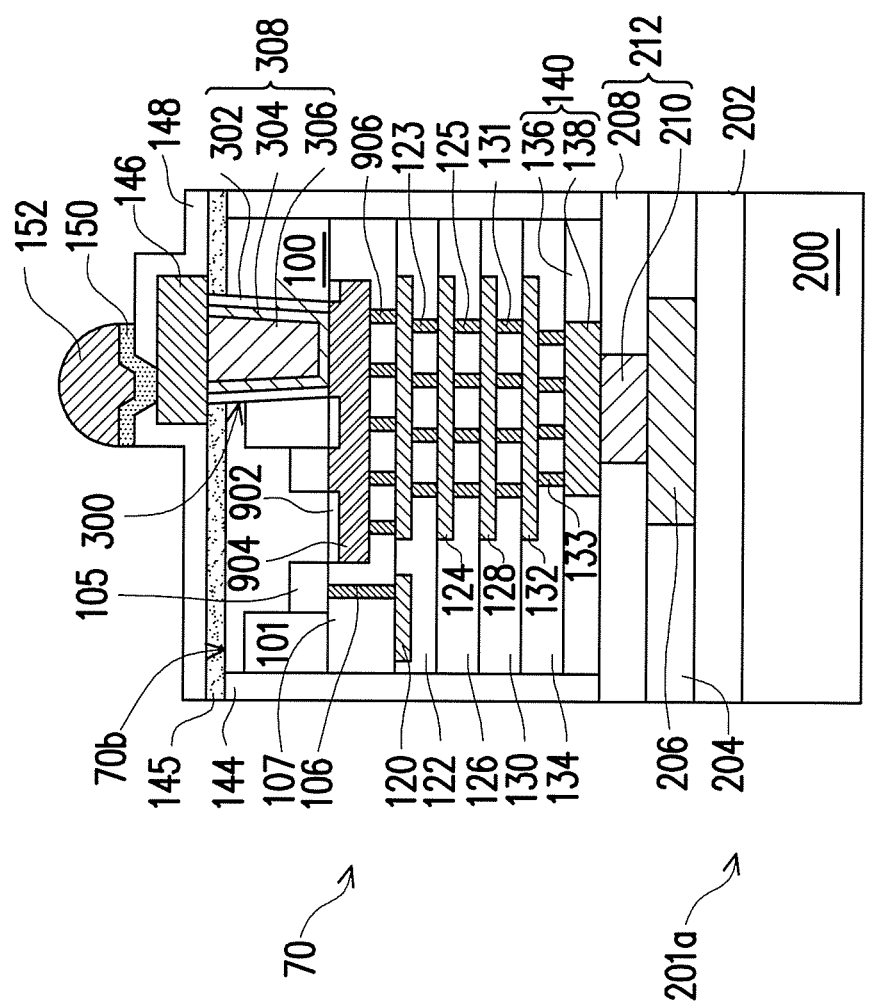

The 3DIC structure of FIG. 14 is similar to that of FIG. 13, and the difference between them lies in that the structure of FIG. 14 is formed by a "TSV last" process while the structure of FIG. 13 is formed by a "TSV first" process. Therefore, their TSV shapes are different. The gate dielectric layer 902, metal gate 904, conductive vias 906 included in each first chip 70 are similar to the gate dielectric layer 802, metal gate 804, conductive vias 806 included in each first chip 60, and the details thereof are not iterated herein.

The 3DIC structures of the present disclosure are illustrated with reference to the cross-sectional views of FIG. 1F, FIG. 3F and FIG. 11 to FIG. 14.

In some embodiments, a 3DIC structure includes a first chip 10/30/40/50/60/70, a second chip 201a and at least one TSV 118/308. The first chip 10/30/40/50/60/70 is bonded to the second chip 201a. In some embodiments, the first chip 10/30/40/50/60/70 is electrically connected to the second chip 201a with a first bonding pad 138 of the first chip 10/30/40/50/60/70 and a second bonding pad 206 of the second chip 201a. At least one TSV 118/308 extends from the first backside 10b/30b/40b/50b/60b/70b of the first chip 10/30/40/50/60/70 to a metallization element of the first chip 10/30/40/50/60/70. Specifically, the TSV 118/308 penetrates through the first substrate 100 of the first chip 10/30/40/50/60/70 and is landed on the metallization element of the first chip 10/30/40/50/60/70.

In some embodiments, the metallization element is a metal line 120 that is the closest to the first backside 10b/30b/40b/50b of the first chip 10/30/40/50, as shown in FIG. 1F, FIG. 3F and FIG. 11 to FIG. 12. In some embodiments, the metallization element is a metal gate 804/904 of the first chip 60/70, as shown in FIG. 13 to FIG. 14.

It is noted that, in the disclosure, the TSV 118/308 is landed on the metallization element that is the closest to the first substrate or the first backside of first chip, so the etching time for defining the TSV opening 110/300 is much less than the etching time for defining the conventional TSV opening through the first and second chips. The conventional TSV usually has a depth of about 50 μm to 100 μm. However, in some embodiments of the disclosure, the TSV 118/308 has a depth in a range from about 2 μm to 15 μm, so the stress induced by TSV can almost be ignored.

Besides, the TSV 118/308 is electrically connected to the first bonding pad 138 with a plurality of conductive vias at substantially the same level, wherein the conductive vias are electrically connected to the first bonding pad 138. In some embodiments, the conductive vias at substantially the same level are conductive vias 123, 125, 131 or 133, as shown in FIG. 1F, FIG. 3F and FIG. 11 to FIG. 14. In some embodiments, the conductive vias at substantially the same level are conductive vias 806 or 906, as shown in FIG. 11 to FIG. 12. In some embodiments, at least a portion of the conductive vias are stripe-shaped conductive vias at substantially the same level, as shown in FIG. 6 to FIG. 10.

In some embodiments, when the 3DIC structure is formed by a "TSV first" process, the area of the TSV 118 exposed by the first backside 10b/40b/60b is smaller than the area of the TSV 118 contacting the metallization element (e.g., metal line 120 or metal gate 804) of the first chip 10/40/60, as shown in FIG. 1F, FIG. 11 and FIG. 13. In such case, the TSV 118 includes a metal layer 116 and a diffusion barrier layer 114 aside the metal layer 116.

In some embodiments, when the 3DIC structure is formed by a "TSV last" process, the area of the TSV 308 exposed by the first backside 30b/50b/70b is greater than the area of the TSV 308 contacting the metallization element (e.g., metal line 120 or metal gate 904) of the first chip 30/50/70, as shown in FIG. 3F, FIG. 12 and FIG. 14. In such case, the TSV 308 includes a metal layer 306 and a diffusion barrier layer 304 aside the metal layer 306 and between the metal layer 306 and the metallization element (e.g., metal line 120 or metal gate 904).

In view of the above, the present disclosure provides 3DIC structures, in which multiple stripe-shaped conductive vias are disposed between the TSV and the bonding pad of the first chip. Such configuration is beneficial to uniformly distribute or spread the current from the TSV to multiple conductive vias and therefore the bonding pad, so the device reliability is greatly improved. Specifically, as compared to the conventional single-via design, the multiple-stripe-shaped-via design at the same level between the TSV and the bonding pad is beneficial to uniformly distribute the current from the larger TSV to the smaller bonding pad, so the device performance is accordingly enhanced, and the conventional current crowding effect is not observed.

In accordance with some embodiments of the present disclosure, a 3DIC structure includes a first chip, a second chip and at least one TSV. The first chip is electrically connected to the second chip with a first bonding pad of the first chip and a second bonding pad of the second chip. The TSV extends from a first backside of the first chip to a metallization element of the first chip. At least one conductive via is electrically connected between the TSV and the first bonding pad, and at least one elongated slot or closed space is within the at least one conductive via.

In accordance with alternative embodiments of the present disclosure, a 3DIC structure includes a first chip, a second chip and at least one TSV. The first chip is bonded to the second chip through a hybrid bonding including a metal-to-metal bonding and a dielectric-to-dielectric bonding. The TSV penetrates through a first substrate of the first chip and is electrically connected to the second chip with a plurality of stripe-shaped conductive vias.

In accordance with yet alternative embodiments of the present disclosure, a 3DIC structure includes a first chip, a second chip and at least one TSV. The first chip is bonded to a second chip. The TSV penetrates through a first substrate of the first chip and is landed on a metal gate of the first chip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional integrated circuit structure, comprising:
    a first chip electrically connected to a second chip with a first bonding pad of the first chip and a second bonding pad of the second chip; and
    at least one through substrate via (TSV), extending from a first backside of the first chip to a metallization element of the first chip,
    wherein at least one conductive via is electrically connected between the TSV and the first bonding pad, and at least one elongated slot or closed space, from a top view, is within the at least one conductive via.

2. The three-dimensional integrated circuit structure of claim 1, wherein the metallization element is a metal line the closest to the first backside of the first chip.

3. The three-dimensional integrated circuit structure of claim 1, wherein the metallization element is a metal gate of the first chip.

4. The three-dimensional integrated circuit structure of claim 1, further comprising a dielectric material filling the at least one elongated slot or closed space within the at least one conductive via.

5. The three-dimensional integrated circuit structure of claim 1, wherein a first area of the TSV exposed by the first backside is smaller than a second area of the TSV contacting the metallization element of the first chip.

6. The three-dimensional integrated circuit structure of claim 5, wherein a first area of the TSV exposed by the first backside is greater than a second area of the TSV contacting the metallization element of the first chip.

7. The three-dimensional integrated circuit structure of claim 1, wherein the at least one conductive via comprises a plurality of conductive vias formed as walls substantially parallel to each other.

8. The three-dimensional integrated circuit structure of claim 1, wherein the at least one conductive via comprises a plurality of conductive vias formed as concentric rings.

9. The three-dimensional integrated circuit structure of claim 1, wherein the at least one conductive via has a fence shape.

10. A three-dimensional integrated circuit structure, comprising:
    a first chip bonded to a second chip through a hybrid bonding comprising a metal-to-metal bonding and a dielectric-to-dielectric bonding; and
    at least one through substrate via (TSV) penetrating through a first substrate of the first chip and electrically connected to the second chip with a plurality of stripe-shaped conductive vias.

11. The three-dimensional integrated circuit structure of claim 10, wherein the stripe-shaped conductive vias are separated from each other.

12. The three-dimensional integrated circuit structure of claim 10, wherein at least a portion of the stripe-shaped conductive vias are connected.

13. The three-dimensional integrated circuit structure of claim 10, wherein the stripe-shaped conductive vias are formed as walls, fences, rings or a combination thereof.

14. The three-dimensional integrated circuit structure of claim 10, wherein the TSV is landed on a metal line closest to the first substrate of the first chip.

15. The three-dimensional integrated circuit structure of claim 10, wherein the TSV is landed on a metal gate of the first chip.

16. A three-dimensional integrated circuit structure, comprising:
    a first chip bonded to a second chip; and
    at least one through substrate via (TSV) penetrating through a first substrate of the first chip and landed on a metal gate of the first chip.

17. The three-dimensional integrated circuit structure of claim 16, wherein the first chip comprises, over the first substrate, a plurality of conductive layers and a plurality of conductive vias between two adjacent conductive layers and electrically connected to the TSV.

18. The three-dimensional integrated circuit structure of claim 17, wherein the conductive vias are formed as pillars, walls, fences, rings or a combination thereof.

19. The three-dimensional integrated circuit structure of claim 17, wherein the first chip further comprises a plurality of stripe-shaped conductive vias electrically connected between the metal gate and a conductive layer the closest to the metal gate.

20. The three-dimensional integrated circuit structure of claim 19, wherein the stripe-shaped conductive vias are formed as walls, fences, rings or a combination thereof.

* * * * *